(12) United States Patent
Guo et al.

(10) Patent No.: US 11,721,776 B2
(45) Date of Patent: Aug. 8, 2023

(54) PHOTOVOLTAIC MODULE

(71) Applicants: SHANGHAI JINKO GREEN ENERGY ENTERPRISE MANAGEMENT CO., LTD, Shanghai (CN); ZHEJIANG JINKO SOLAR CO., LTD., Zhejiang (CN)

(72) Inventors: Zhiqiu Guo, Zhejiang (CN); Guohui Hao, Zhejiang (CN); Wusong Tao, Zhejiang (CN); Shiliang Huang, Zhejiang (CN); Luchuang Wang, Zhejiang (CN); Yingying Peng, Zhejiang (CN)

(73) Assignees: Shanghai Jinko Green Energy Enterprise Management Co., Ltd., Shanghai (CN); Zhejiang Jinko Solar Co., Ltd., Zhejiang (CN)

( * ) Notice: Subject to any disclaimer, the term of this patent is extended or adjusted under 35 U.S.C. 154(b) by 0 days.

(21) Appl. No.: 17/459,614

(22) Filed: Aug. 27, 2021

(65) Prior Publication Data

US 2023/0026617 A1    Jan. 26, 2023

(30) Foreign Application Priority Data

Jul. 16, 2021    (CN) .......................... 202110807252.5
Jul. 16, 2021    (CN) .......................... 202121625350.9

(51) Int. Cl.
*H01L 31/05*    (2014.01)
*H01L 31/054*   (2014.01)
*H01L 31/048*   (2014.01)

(52) U.S. Cl.
CPC ...... *H01L 31/0508* (2013.01); *H01L 31/0488* (2013.01); *H01L 31/0512* (2013.01); *H01L 31/0547* (2014.12)

(58) Field of Classification Search
CPC ............. H01L 31/0508; H01L 31/0547; H01L 31/0488; H01L 31/0512
See application file for complete search history.

(56) References Cited

U.S. PATENT DOCUMENTS

2012/0192918 A1    8/2012    Zhou et al.
2012/0325282 A1    12/2012   Snow et al.

FOREIGN PATENT DOCUMENTS

| CN | 110112104 | 8/2019 |
|---|---|---|
| CN | 209708961 | 11/2019 |

(Continued)

OTHER PUBLICATIONS

JP 2015-170640 A Machine translaiton as provided by FIT Database, translated on Dec. 2, 2022.*

(Continued)

*Primary Examiner* — Golam Mowla
(74) *Attorney, Agent, or Firm* — Nixon Peabody LLP; Jeffrey L. Costellia

(57) ABSTRACT

Provided are a photovoltaic module, comprising a solar cell string having a plurality of solar cells arranged in sequence, adjacent solar cells being connected by solder strips, the solder strip being connected to a front surface of one solar cell and to a back surface of the other solar cell, a long-side dimension of the solar cell being within a range of 150 mm to 220 mm; two protective adhesive layers respectively covering front and back surfaces of the solar cell string, a dimensional difference between thicknesses of one protective adhesive layer and the solder strip being defined as first thickness, a ratio of the first thickness to the thickness of one protective adhesive layer being not less than 0 and not greater than 20%; a transparent plate covering the protective adhesive layer on the front surface; and a back plate covering the protective adhesive layer on the back surface.

10 Claims, 12 Drawing Sheets

(56) References Cited

FOREIGN PATENT DOCUMENTS

| CN | 210156399 | 3/2020 |
|---|---|---|
| CN | 211578765 | 9/2020 |
| CN | 212625609 | 2/2021 |
| DE | 202021104478 | 9/2021 |
| JP | 2005-317904 | 11/2002 |
| JP | 2005-072567 | 3/2005 |
| JP | 2012-134393 | 7/2012 |
| JP | 2015-170640 | 9/2015 |
| JP | 2021-512505 | 5/2021 |
| WO | WO-2020/177530 | 9/2020 |

OTHER PUBLICATIONS

JP 2005-072567 A Machine translaiton as provided by FIT Database, translated on Dec. 2, 2022.*
CN 211578765 U Machine translaiton as provided by FIT Database, translated on Dec. 2, 2022.*
German Office Action for Application No. 1B GM 85/2021, dated Nov. 9, 2021 (2 pages).
European Search Report for Application No. 21192997.1, dated Feb. 28, 2022 (14 pages).
Australia Office Action for Application No. 2021221523, dated Jul. 21, 2022 (7 pages).
Japanese Notice of Reason for Rejection for Application No. 2021-137416, dated May 26, 2022, (16 pages).
European Search Report for Application No. 21192997.1, dated Jun. 1, 2022, (12 pages).
Song, et al., "Effect of interconnect geometry on the evolution of stresses in a solar photovoltaic laminate during and after lamination", Solar Energy Materials and Solar Cells, vol. 187, Aug. 22, 2018, pp. 241-248.
Oreski et al., "Investigation of effects due to encapsulation thickness reduction in light weight modules". $33^{rd}$ European Photovoltaic Solar Energy Conference and Exhibition Proceedings of the International Conference, Sep. 25, 2017.
Schneider, et al., "Impact of Ribbon Specification and Handling During PV Module Manufacturing to Module Reliability", $32^{nd}$ European Photovoltaic Solar Energy Conference and Exhibition, pp. 1583-1588.
Japanese Notice of Allowance (Application No. 2021-137416) dated Nov. 15, 2022 (6 pgs).

* cited by examiner

52

PHOTOVOLTAIC MODULE

CROSS-REFERENCE TO RELATED APPLICATIONS

The present application claims priority to Chinese Patent Application No. 202110807252.5, filed on Jul. 16, 2021, and to Chinese Patent Application No. 202121625350.9, filed on Jul. 16, 2021, the contents of both of which are incorporated herein by reference in their entireties.

TECHNICAL FIELD

The present disclosure relates to the technical field of photovoltaic production, and in particular to a photovoltaic module.

BACKGROUND

Photovoltaic solar cells are connected by solder strips to form solar cell strings, which can achieve power generation. At present, circular solder strips are used in combination with a multi-grid technology in the industry to implement high-efficiency output modules. The solar cells are connected to each other by solder strips arranged on a surface of the solar cell to form a solar cell string, and a certain spacing is provided between adjacent solar cells. Non-cell regions (gaps between two adjacent solar cells) inside the module cannot be used for power generation, resulting in a waste of space in a power station.

The solar cell string is provided with a transparent plate on its front surface and a back plate on its back surface. A protective adhesive layer is respectively arranged between the solar cell string and the transparent plate and between the solar cell string and the back plate. A photovoltaic module is formed by pressing an external lamination force in a direction perpendicular to a surface of the solar cell string. The protective adhesive layer can prevent micro-cracks caused by lamination pressure directly transferred through the solder strip to the surface of the solar cell when the solder strip comes into rigid contact with the transparent plate or the back plate. In order to achieve a reliable protective effect, the thickness of the protective adhesive layer needs to be matched with the structural size of the solder strip.

SUMMARY

The present disclosure provides a photovoltaic module to lower the risk of micro-cracks in the solar cells.

According to a first aspect of the present disclosure, there is provided a photovoltaic module, including:

a solar cell string comprising a plurality of solar cells, adjacent two of the plurality of solar cells being connected by a solder strip, wherein the solder strip is connected to a front surface of one solar cell and to a back surface of another solar cell, and a long-side size of the solar cell is within a range of 150 mm to 220 mm;

two protective adhesive layers respectively covering a front surface and a back surface of the solar cell string, wherein a size difference between a thickness of one protective adhesive layer and a thickness of the solder strip is defined as a first thickness, a ratio of the first thickness to the thickness of one protective adhesive layer is not less than 0 and not greater than 20%; or the photovoltaic module is manufactured through a lamination process, the protective adhesive layers are formed by pressing adhesive films applied in advance to cover the front surface and the back surface of the solar cell string, a difference between the thickness of one adhesive film and the thickness of the solder strip is defined as a second thickness, and a ratio of the second thickness to the thickness of one adhesive film is not less than 25% and not greater than 40%;

a transparent plate covering a surface of the protective adhesive layer on the front surface of the solar cell string; and a back plate covering a surface of the protective adhesive layer on the back surface of the solar cell string.

According to a second aspect of the present disclosure, there is provided is a photovoltaic module, including a solar cell string, and the solar cell string including:

a plurality of solar cells cut from a solar cell substrate along a first direction, wherein a number of the plurality of solar cells is N and N≥2, the plurality of solar cells is arranged in sequence along the first direction, each of the plurality of solar cells comprises a single-layer region and an overlapping region, and adjacent solar cells are stacked in the overlapping region; and a plurality of solder strips each being welded to a front surface of one of the plurality of solar cells and a back surface of another solar cell to connect the two adjacent solar cells together, the plurality of solder strips each comprising a reflective section and a flat section connected to the reflective section, wherein the reflective section is located on the front surface of the solar cell and welded to the single-layer region, the flat section is at least partially located in the overlapping region between the two stacked solar cells, a thickness of the reflective section is within a range of 0.18 mm to 0.27 mm, and a thickness of the flat section is within a range of 0.08 mm to 0.15 mm.

The technical solution of the present disclosure can achieve the following beneficial effects:

According to the photovoltaic module of the present disclosure, by limiting the thickness ratio range of the adhesive layer, the thickness of the adhesive layer and the size of the solder strip can be reasonably matched, thereby reducing the risk of micro-cracks and accordingly reducing the power attenuation of the photovoltaic module.

In addition, the solar cells are 1/N solar cells and used together with thin solder strips, which can increase power generation. Thinner solder strips can bring less pressure to the surface of the solar cell, even when a thin protective adhesive layer is adopted, thereby further reducing production cost of the photovoltaic module. A part of the solder strip corresponding to the overlapping region is designed flat to increase the contact area between the solar cell and the solder strip, reduce the intensity of pressure subjected by the solar cell after contacting the solder strip. When the flat section is placed at the overlapping region of adjacent two solar cells, the gap in the overlapping region of the two adjacent solar cells in the thickness direction can be reduced and thus lowering the risk of micro-cracks in the overlapping region of the solar cell.

It should be understood that the above general description and the following detailed description are only exemplary and cannot limit the present disclosure.

REFERENCE SIGNS

1—solar cell;
2—protective adhesive layer;
3—transparent plate;
4—back plate;
5—solder strip;
　50—reflective section
　52—flat section;
　　520—body
　　522—transitional section;
6—busbar; and
7—solar cell string.

The drawings here are incorporated into the description and constitute a part of the description. The drawings show embodiments that conform to the present disclosure, and are used together with the description to explain the principle of the present disclosure.

DESCRIPTION OF EMBODIMENTS

In order to provide a more clear explanation for the objectives, technical solutions and advantages of the present disclosure, the present disclosure will be described in further detail below in conjunction with accompanying drawings and embodiments. It should be understood that the specific embodiments described here are only for explaining the present invention rather than providing any limitation.

In the present disclosure, unless explicitly stated and defined otherwise, the terms "first" and "second" are merely used for description, and shall not be understood as an indication or implication of relative importance. The term "a plurality of" means two or more, unless otherwise defined. The terms "connect", "fix" and the like shall be understood broadly; for example, a connection may be a fixed connection, a detachable connection, or an integrated connection, or an electrical connection, and may be a direct connection and may also be an indirect connection through an intermediate medium. For those skilled in the art, the specific meanings of the above terms in the present disclosure can be understood based on a specific situation.

In descriptions of the present disclosure, it should be understood that, directional words such as "above" and "below" described in embodiments of the present disclosure are used for description based on the accompanying drawings and should not be understood as a limitation to the embodiments of the present disclosure. In addition, in the context, it should also be understood that when it is mentioned that a component is connected "above" or "below" another component, it can not only be directly connected "above" or "below" the other component, but also be indirectly connected "above" or "below" another component through an intermediate component.

Figure 1:
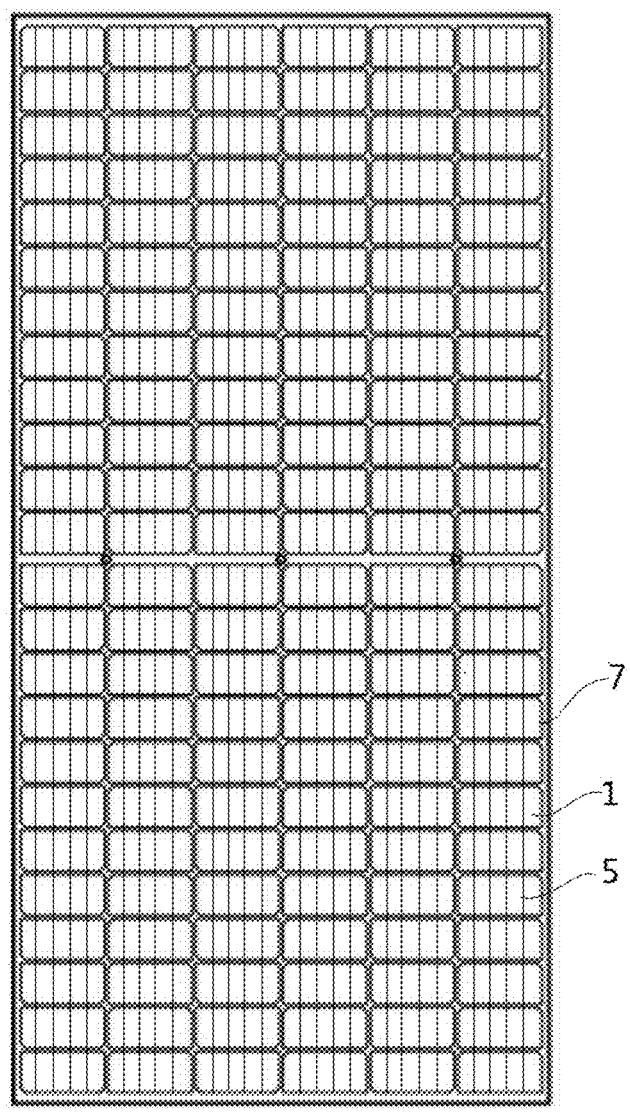
FIG. 1 is a schematic structural diagram of a photovoltaic module according to an embodiment of the present disclosure.
Figure 2:
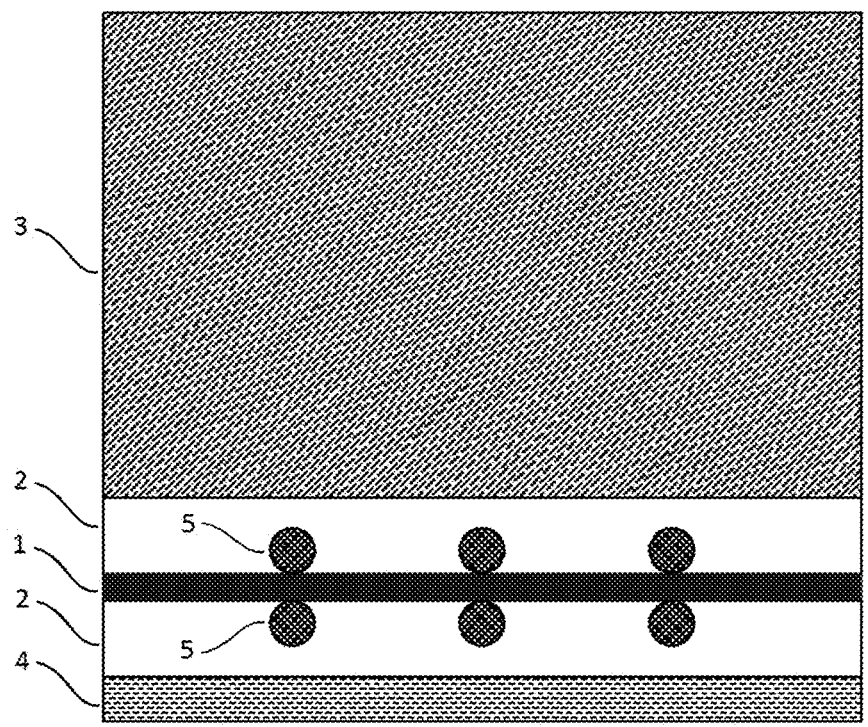
FIG. 2 is a schematic structural cross-sectional diagram of a photovoltaic module according to an embodiment of the present disclosure.
Figure 3:
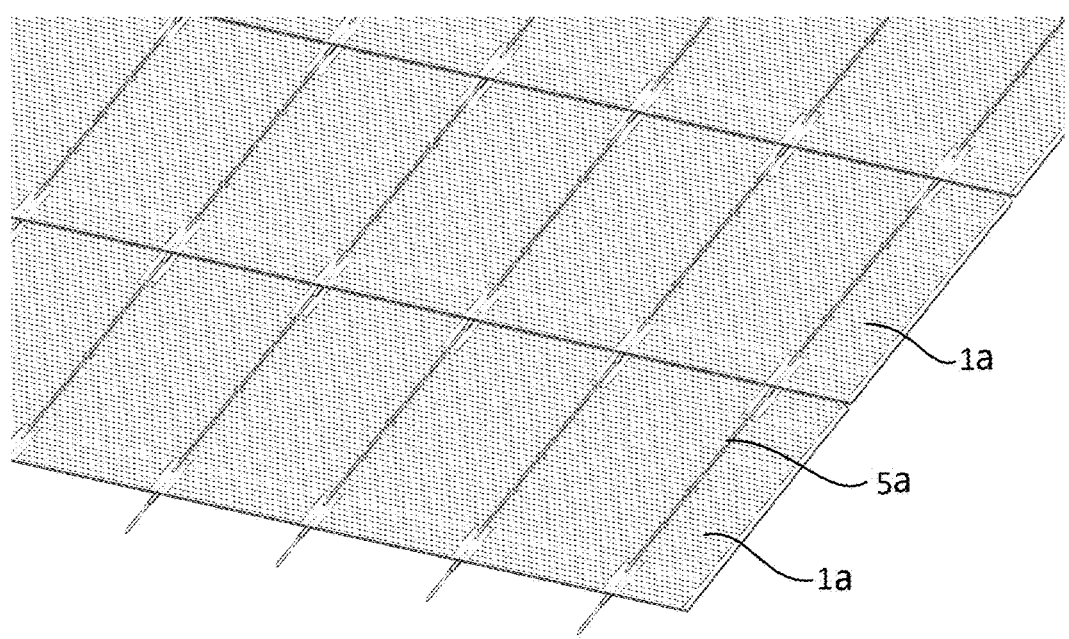
FIG. 3 is a schematic partial structural diagram of a photovoltaic module according to a first embodiment of the present disclosure.
Figure 4:
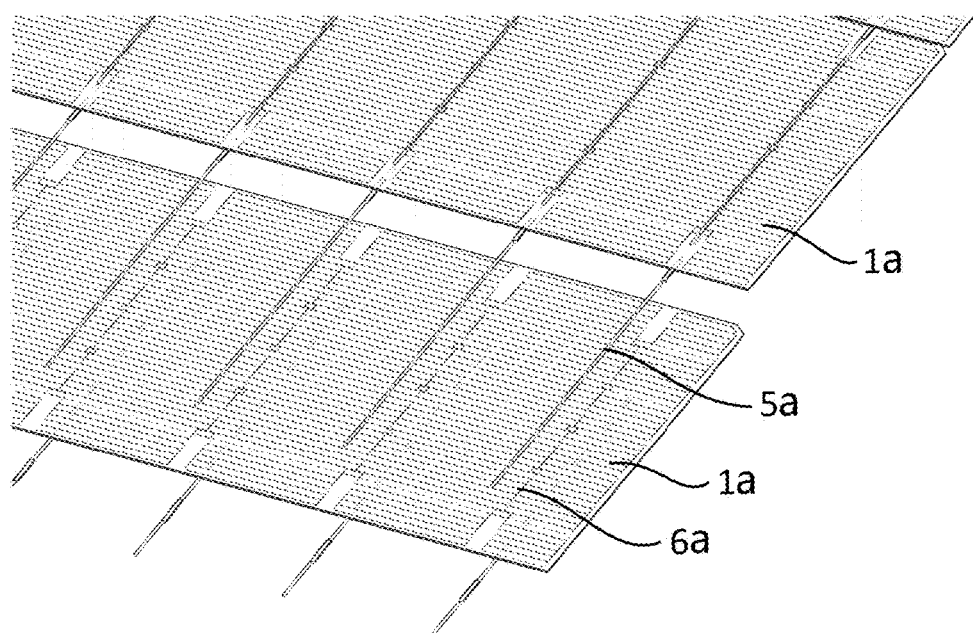
FIG. 4 is a schematic exploded structural diagram of FIG. 3.
Figure 5:
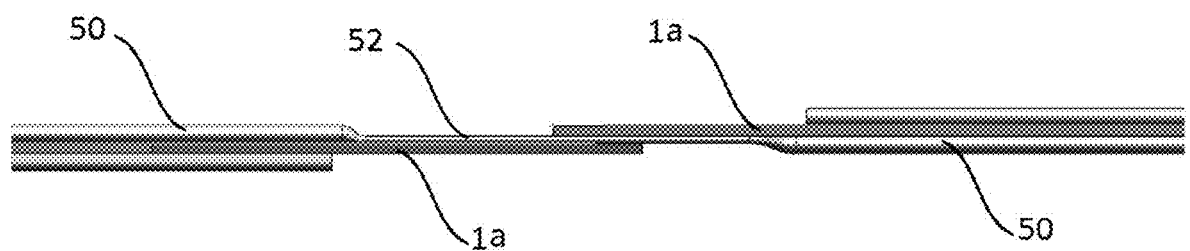
FIG. 5 is a schematic longitudinal-section diagram of a photovoltaic module according to the first embodiment of the present disclosure.

As shown in FIG. 1 to FIG. 2, various embodiments of the present disclosure provide a photovoltaic module, including a solar cell string layer, a protective adhesive layer 2, a transparent plate 3, and a back plate 4. The solar cell string layer includes a plurality of solar cell strings 7. Each battery string 7 includes a plurality of solar cells 1, arranged in sequence along a first direction. Adjacent solar cells 1 are connected by a solder strip 5, and the solder strip 5 connects a front surface of one of the adjacent solar cells 1 and a back surface of the other one of the adjacent solar cells together. The solar cell 1 may not be provided with busbars on the surface, or at least one busbar extending in the first direction may be arranged on the solar cell 1. When the solar cell 1 is provided with busbars, the solder strip 5 is welded to the busbar on the front surface of one of the solar cells 1 and to the busbar on the back surface of the adjacent solar cell 1, thus connecting the adjacent solar cells 1 together. The plurality of solar cells 7 are arranged in sequence along a second direction, and the second direction is perpendicular to the first direction. The transparent plate 3 is arranged on a front surface of the solar cell string 7, and sunlight can pass through the transparent plate 3 and reach the surface of the solar cell string. The back plate 4 is arranged on a back surface of the solar cell string. The back plate 4 can be made of a transparent material so that the photovoltaic module is formed as a double-side light transmissible module, or the back plate 4 can also be made of an opaque material so that the photovoltaic module is formed as a single-side light transmissible module. The protective adhesive layer 2 covers two surfaces of the solar cell string 7, that is, a protective adhesive layer is respectively arranged between the solar cell 1 and the transparent plate 3, and between the solar cell 1 and the back plate 4. The protective adhesive layer can be made of a hot melt adhesive such as ethylene-vinyl acetate (EVA) or polyolefin elastomer (POE). The photovoltaic module is formed into a laminated structure including the transparent plate 3, the protective adhesive layer 2, the solar cell 1, the protective adhesive layer 2 and the back plate 4 arranged in sequence from top to bottom through a lamination process. In addition, the protective adhesive layer 2 can also protect the solar cell 1 to prevent the solar cell 1 from contacting the transparent plate 3 or the back plate 4 and causing micro-cracks.

It should be noted that in the above embodiments, a solar cell having busbars is used as an example for description. In other embodiments, the solar cell 1 can also be a solar cell without busbars on the surface, and in this case, the solder strip can be directly welded to a preset welding spot on the surface of the solar cell to realize the connection with the solar cell.

The thickness of the solar cell 1 is within a range of 0.1 mm to 0.3 mm. For example, the thickness of the solar cell 1 may be 0.1 mm, 0.2 mm, 0.3 mm, or the like. A thin solar cell with a thickness of 0.17 mm to 0.19 mm is preferred. For example, the thickness of the solar cell 1 may be 0.17 mm, 0.18 mm, 0.19 mm, or the like, which is contributive to reducing overall weight and cost. The long-side dimension of the solar cell 1 is within a range of 150 mm to 220 mm, that is, the dimension in a direction perpendicular to the arrangement direction of the solar cells in FIG. 1 is within a range of 150 mm to 220 mm. A large-sized solar cell with a long-side dimension of 182 mm to 220 mm is preferred, which can fully increase the generated power and reduce the overall cost of the module. For example, the long-side dimension of the solar cell 1 may be 182 mm, 185 mm, 190 mm, 195 mm, 200 mm, 205 mm, 210 mm, 215 mm, 220 mm, or the like.

The photovoltaic module is made through a lamination process, and adhesive films are applied in advance to cover the front and back surfaces of the solar cell string 7 during manufacture. In this case, the laminated structure includes the transparent plate 3, the adhesive film, the solar cell string 7, the adhesive film, and the back plate 4. A lamination pressure is applied along a stacking direction, so that the adhesive films are pressed to form the protective adhesive layers 2. In the stacking direction, a difference between a thickness of one adhesive film and a thickness of the solder strip 5 is defined as a second thickness, and a ratio of the second thickness to the thickness of one protective film is not less than 25%, and in this way, the protective adhesive layer 2 formed after the lamination can have sufficient thickness at a position facing the solder strip 5, so that the solder strip 5 will not pass through the protective adhesive layer 2 and goes into rigid contact with the transparent plate 3 (or the back plate 4) on the surface of the photovoltaic module, to avoid lamination pressure directly transferred through the solder strip to the surface of the solar cell, thereby reducing the risk of micro-cracks on the solar cell.

In an embodiment, since the thickness of the adhesive film is reduced during the lamination process, and the adhesive film will be molten and redistributed during the lamination process, the thickness of the protective adhesive layer 2, at the position facing the solder strip 5, in the final product is extremely small. In this case, it is more likely to cause the contact between the solder strip 5 and the transparent plate 3 to produce micro-cracks. Moreover, when the solar cells are arranged in sequence, since the solder strip is configured to connect the front and back surfaces of the adjacent solar cells, the solder strip will come into contact with edges of the solar cells to produce a pressure when passing between the solar cells. When the adhesive film selected is too thin, the edges of the solar cells cannot be protected effectively. However, it is not easy to accurately define the thickness change of the adhesive film during the lamination process. Therefore, in the prior art, many experiments and the accumulation of experience are required to determine a matching relationship between the thickness of the adhesive film and the size of the solder strip 5, with poor operability and unwarranted accuracy. Embodiments of the present disclosure define the ratio relationship between the adhesive film and the solder strip 5, it can be ensured that the solder strip 5 will not come into contact with the transparent plate 3 (or the back plate 4) after lamination, showing high operability and high reliability. After batch trial production verification and load test, micro-crack rate of the product is extremely low, and the zero crack rate can reach 90% or above.

Moreover, a ratio of the second thickness to the thickness of one adhesive film is not greater than 40%, that is, the ratio of the second thickness to the thickness of one adhesive film is within a range of 25% to 40%. For example, the ratio can be 25%, 26%, 27%, 28%, 29%, 30%, 31%, 32%, 33%, 34%, 35%, 36%, 37%, 38%, 39%, 40%, or the like. By limiting a range of the ratio, a reasonable match between the thickness of the adhesive film and the size of the solder strip can be achieved, thereby reducing the risk of micro-cracks and reducing the power attenuation of the photovoltaic module. Combined with Table 7 and Table 8 below, when the ratio of the second thickness to the thickness of one adhesive film is within the range of 25% to 40%, the number of micro-cracks can be not greater than 8, and the power attenuation is not greater than 1.0%. In this case, the number of micro-cracks is extremely small, and this range is sufficient to meet the high-standard production requirements, and the produced photovoltaic module has a high power output. When the ratio is less than 25%, the number of micro-cracks and power attenuation are both significantly increased. When the ratio is greater than 40%, the anti-cracking effect and power attenuation are not obviously reduced. When the thickness is too large, it will be difficult for the adhesive film to be fully heated and molten during lamination, which will affect the adhesion and reduce the anti-cracking effect. Moreover, the greater the thickness of the adhesive film is, the greater the pressure will be required during lamination, the risk of micro-cracks will be increased, and thus the increase in thickness will increase the cost.

In an embodiment, for the sake of clarity, in the embodiments of the present disclosure, for different solder strip sizes, the corresponding ratios of the second thickness to the thickness of the adhesive film can be referred to Table 1.

TABLE 1

The ratio of the second thickness to the thickness of the adhesive film

| Gram weight ($g/m^2$) | Adhesive film thickness (mm) | Solder strip thickness (mm) | | | | | | | | | | |
|---|---|---|---|---|---|---|---|---|---|---|---|---|
| | | 0.38 | 0.35 | 0.32 | 0.30 | 0.28 | 0.27 | 0.26 | 0.25 | 0.22 | 0.2 | 0.18 |
| 610 | 0.634 | 40% | 45% | 50% | 53% | 56% | 57% | 59% | 61% | 65% | 68% | 72% |
| 560 | 0.582 | 35% | 40% | 45% | 48% | 52% | 54% | 55% | 57% | 62% | 66% | 69% |
| 530 | 0.551 | 31% | 37% | 42% | 46% | 49% | 51% | 53% | 55% | 60% | 64% | 67% |
| 515 | 0.536 | 29% | 35% | 40% | 44% | 48% | 50% | 51% | 53% | 59% | 63% | 66% |
| 500 | 0.520 | 27% | 33% | 38% | 42% | 46% | 48% | 50% | 52% | 58% | 62% | 65% |

TABLE 1-continued

The ratio of the second thickness to the thickness of the adhesive film

| Gram weight (g/m²) | Adhesive film thickness (mm) | Solder strip thickness (mm) | | | | | | | | | | |
|---|---|---|---|---|---|---|---|---|---|---|---|---|
| | | 0.38 | 0.35 | 0.32 | 0.30 | 0.28 | 0.27 | 0.26 | 0.25 | 0.22 | 0.2 | 0.18 |
| 490 | 0.510 | 25% | 31% | 37% | 41% | 45% | 47% | 49% | 51% | 57% | 61% | 65% |
| 480 | 0.499 | 24% | 30% | 36% | 40% | 44% | 46% | 48% | 50% | 56% | 60% | 64% |
| 460 | 0.478 | 21% | 27% | 33% | 37% | 41% | 44% | 46% | 48% | 54% | 58% | 62% |
| 450 | 0.468 | 19% | 25% | 32% | 36% | 40% | 42% | 44% | 47% | 53% | 57% | 62% |
| 430 | 0.447 | 15% | 22% | 28% | 33% | 37% | 40% | 42% | 44% | 51% | 55% | 60% |
| 420 | 0.437 | 13% | 20% | 27% | 31% | 36% | 38% | 40% | 43% | 50% | 54% | 59% |
| 400 | 0.416 | 9% | 16% | 23% | 28% | 33% | 35% | 38% | 40% | 47% | 52% | 57% |
| 385 | 0.400 | 5% | 13% | 20% | 25% | 30% | 33% | 35% | 38% | 45% | 50% | 55% |
| 370 | 0.385 | 1% | 9% | 17% | 22% | 27% | 30% | 32% | 35% | 43% | 48% | 53% |
| 345 | 0.359 | −6% | 2% | 11% | 16% | 22% | 25% | 28% | 30% | 39% | 44% | 50% |
| 320 | 0.333 | −14% | −5% | 4% | 10% | 16% | 19% | 22% | 25% | 34% | 40% | 46% |
| 290 | 0.302 | −26% | −16% | −6% | 1% | 7% | 10% | 14% | 17% | 27% | 34% | 40% |
| 270 | 0.281 | −35% | −25% | −14% | −7% | 0% | 4% | 7% | 11% | 22% | 29% | 36% |
| 255 | 0.265 | −43% | −32% | −21% | −13% | −6% | −2% | 2% | 6% | 17% | 25% | 32% |
| 245 | 0.255 | −49% | −37% | −26% | −18% | −10% | −6% | −2% | 2% | 14% | 22% | 29% |
| 230 | 0.239 | −59% | −46% | −34% | −25% | −17% | −13% | −9% | −5% | 8% | 16% | 25% |

According to the actual measurement in the production process, the thickness of the adhesive film will be reduced by 25% to 30% under the action of laminating pressure to form the protective adhesive layer 2 in the final product. Therefore, the difference between the thickness of one protective adhesive layer 2 formed under the action of laminating pressure and the thickness of the solder strip 5 is defined as a first thickness. By conversion of the ratio (25% to 40%) of the second thickness to the thickness of the adhesive film and taking the actual production detection results into consideration, the ratio of the first thickness of the final photovoltaic module product to the thickness of the protective adhesive layer 2 is defined to be not less than 0 and not greater than 20%. When the ratio of the first thickness to the thickness of the protective adhesive layer is less than 0, that is, when the thickness of the protective adhesive layer 2 formed after lamination is less than the thickness of the solder strip 5, the solder strip 5 can easily penetrate through the protective adhesive layer and comes into direct contact with the transparent plate 3 or the back plate 4, the lamination pressure is directly transferred to the surface of the solar cell through the solder strip 5, which will cause the increase in the number of micro-cracks in the solar cell and power attenuation, and thus it is difficult to ensure the protection effect.

Embodiment 1

Referring to FIGS. 3 to 9, the connection in the photovoltaic module according to the embodiments of the present disclosure is implemented by a stack-welding technology. That is, a plurality of solar cells 1a are arranged in sequence along the first direction. The solar cell 1a includes a single-layer region and an overlapping region, and adjacent solar cells 1a are stacked in the overlapping region, that is, the solar cells 1a are in a shingled arrangement to reduce a gap between the solar cells 1a so that the total area occupied by the plurality of solar cells 1a is not greater than the sum of the areas of all the solar cells, thereby ensuring the output efficiency of the module and enhancing the space utilization of a power station. Based on this design, the solar cell module is a stack-welded module. There are overlapping regions between adjacent solar cells in the stack-welded module, and the solder strip 5a is sandwiched between the overlapping regions of the adjacent solar cells. In this way, during lamination, it is easier to cause deformation and cracks in the overlapping regions of the solar cells. The requirement for the thickness of the adhesive layer is strict, and a protective adhesive layer with a larger thickness is required to protect the overlapping regions of the solar cells. Therefore, in the stack-welded module, the ratio of the first thickness to the thickness of the protective adhesive layer 2 can be defined to be not less than 5% and not greater than 20%, or the protective adhesive layer 2 has a gram weight of 245 g/m² to 610 g/m². For example, the ratio of the first thickness to the thickness of the protective adhesive layer may be 5%, 7%, 9%, 11%, 13%, 15%, 17%, 19%, 20%, or the like. It should be noted that the gram weight refers to the mass of the protective adhesive layer per square meter, and the gram weight value of the adhesive film before lamination and the gram weight value of the protective adhesive layer 2 after lamination are consistent. The correspondence between the gram weight and the thickness of the film before lamination is shown in Table 1.

However, in the stack-welding technology, there is a gap in a thickness direction in an overlapping region of two adjacent solar cells 1a. During the lamination process, the solder strip 5a in this gap is likely to generate a large pressure on the solar cells 1a, which causes a high risk of micro-cracks to the solar cells.

Figure 6:
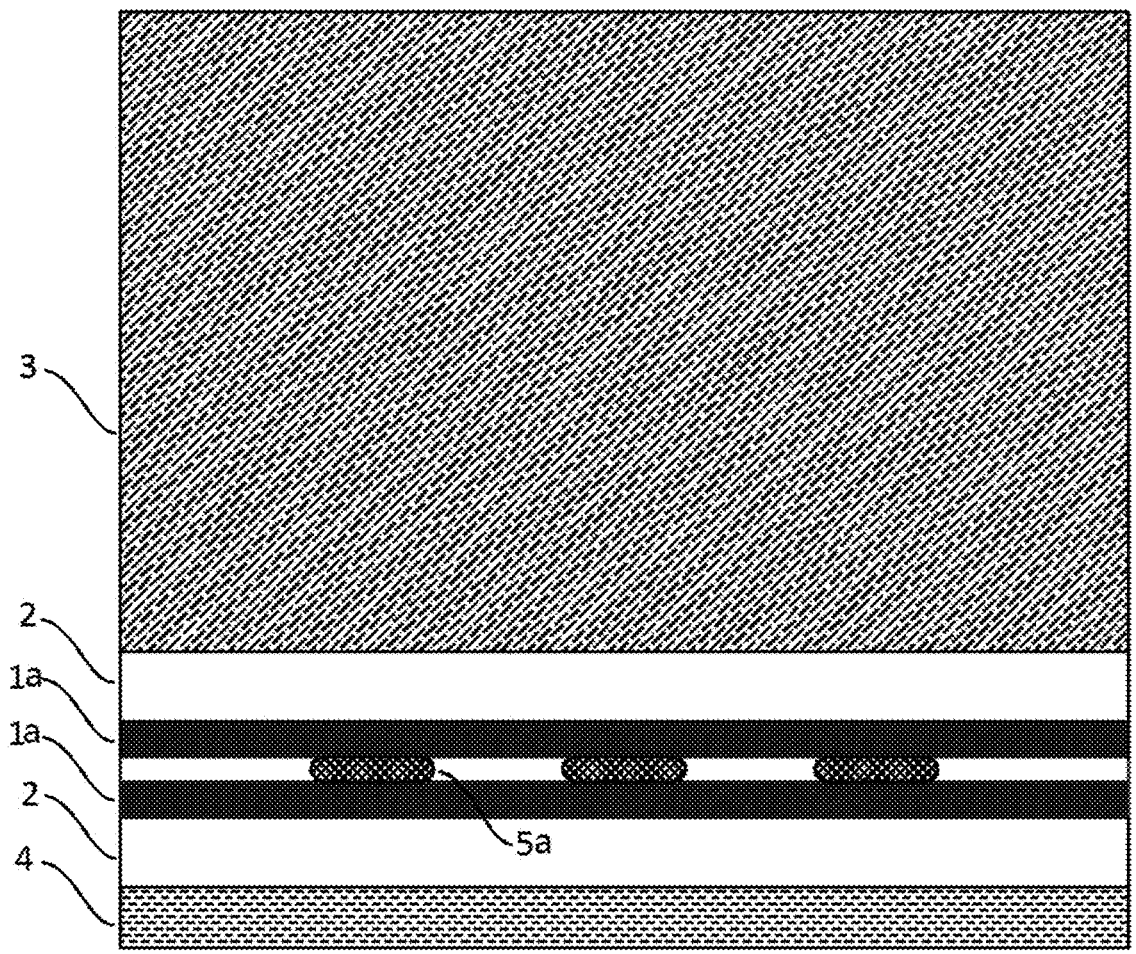
FIG. 6 is a schematic cross-sectional diagram of a photovoltaic module in an overlapping region of a solar cell according to the first embodiment of the present disclosure.
Figure 7:
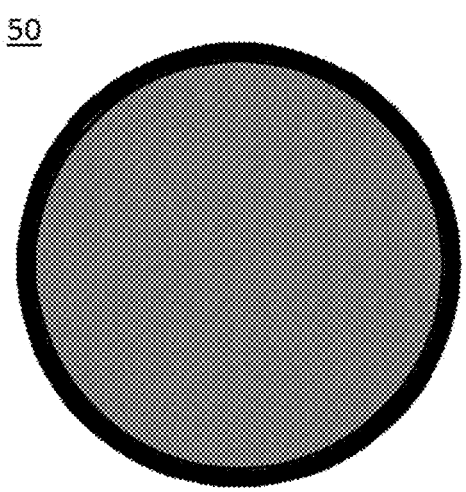
FIG. 7 is a schematic cross-sectional diagram of a reflective section of a solder strip according to the first embodiment of the present disclosure.
Figure 8:
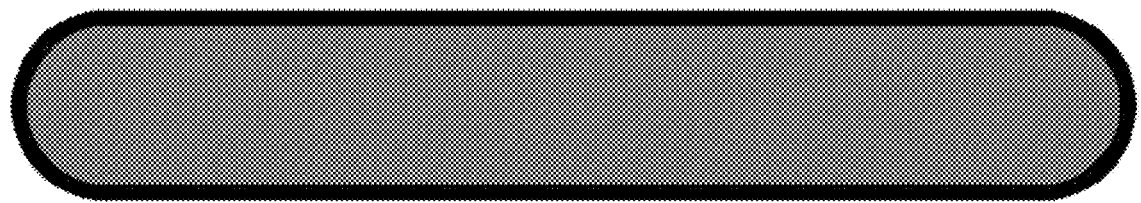
FIG. 8 is a schematic cross-sectional diagram of a flat section of a solder strip according to the first embodiment of the present disclosure.

Referring to FIGS. 6 and 8, in the above stack-welded module, the solder strip 1a may be a thin solder strip, designed to include a reflective section 50 and a flat section 52. The reflective section 50, located on the front surface of the solar cell 1 and welded to the single-layer region, can efficiently reflect light incident on its surface to the front surface of the solar cell 1 while transmitting current so that the light is fully utilized. For example, the reflective section 50 can reflect light incident on its surface to the transparent plate 3 and then to the surface of the solar cell 1 for reuse. The flat section 52 is at least partially arranged in the overlapping region between the two stacked solar cells 1. In other words, the part of the solder strip 5 corresponding to the overlapping region is flat, thus increasing the contact area between the solar cell 1 and the solder strip 5, reducing the intensity of pressure subjected by solar cell 1 after contacting the solder strip 5. In addition, with a thin thickness of the flat section 52 of the solder strip 5, when placing the flat section at the overlapping region of adjacent two solar cells, the gap of the overlapping region in the thickness direction can be reduced, and the deformation of the solar cell 1 under pressure is also reduced, thereby lowering the risk of micro-cracks in the overlapping region of the solar cell 1.

In some of the embodiments, the flat section 52 is also arranged on the back surface of the solar cell 1a and welded to the single-layer region. In this embodiment, the solder strip 5a is of a two-section design including a reflective section 50 and a flat section 52. With a simple structure, the solder strip can be manufactured easily just by flattening the solder strip arranged on the back surface of the solar cell 1a. It is appreciated that, the reflective section 50 can also be welded to the back surface of the solar cell 1a, and the reflective section 50 on the back surface is used to reflect and re-use light. The solder strip in this form is particularly suitable for a double-sided photovoltaic module.

The length of the flat section 52 should not be less than the width of the overlapping region, so that the overlapping region comes into full contact through the flat section 52, thereby avoiding the following situation: the reflective section 50 extends into the overlapping region, and consequently the flat section 52 and the solar cell 1a form empty space, thus causing micro-cracks in the solar cell 1a during lamination.

In an embodiment, a thickness of the reflective section 50 is within a range of 0.18 mm to 0.27 mm. For example, the thickness of the reflective section 50 may be 0.18 mm, 0.19 mm, 0.20 mm, 0.21 mm, 0.22 mm, 0.23 mm, 0.24 mm, 0.25 mm, 0.27 mm, or the like. A thickness of the flat section 52 is within a range of 0.08 mm to 0.15 mm. For example, the thickness of the flat section 52 may be 0.08 mm, 0.09 mm, 0.10 mm, 0.11 mm, 0.12 mm, 0.13 mm, 0.14 mm, 0.15 mm, or the like. The solder strip 5a of the above thin structure having an extremely small size can meet the current load requirements to ensure a safe current collection effect, and the thin solder strip 5a applies smaller pressure to the surface of the solar cell 1a and does not easily pass through the protective adhesive layer 2, thereby effectively reducing the micro-cracks in the solar cell 1a during lamination of the photovoltaic module. When the thickness of the reflective section 50 is less than 0.18 mm, the solder strip 5a is too thin with an excessive small cross section, and as a result the solder strip 5a has a too small current load capacity and is easily fused during use, which affects the normal current collection. When the thickness of the reflective section 50 is greater than 0.27 mm, larger pressure will be applied to the surface of the solar cell 1a. When the thickness of the reflective section 50 is greater than 0.27 mm, the risk of micro-cracks in the solar cell 1a will be increased during the lamination of the photovoltaic module.

Referring to the data in Table 2 to Table 4, the combination of the reflective section 50 and the flat section 52 where the diameter of the reflective section 50 is 0.18 mm and the thickness of the flat section 52 is 0.08 mm, 0.1 mm, 0.12 mm or 0.15 mm can achieve an effect that the number of micro-cracks is not greater than 2 and the power attenuation is not greater than 0.90%; the combination of the reflective section 50 and the flat section 52 where the thickness of the reflective section 50 is 0.2 mm and the thickness of the flat section 52 is 0.08 mm, 0.1 mm, 0.12 mm or 0.15 mm can achieve an effect that the number of micro-cracks is not greater than 4 and the power attenuation is not greater than 0.98%; the combination of the reflective section 50 and the flat section 52 where the diameter of the reflective section 50 is 0.27 mm and the thickness of the flat section 52 is within a range of 0.08 mm to 0.15 mm and can be 0.08 mm, 0.1 mm, 0.12 mm or 0.15 mm can achieve an effect that the number of micro-cracks is not greater than 4 and the power attenuation is not greater than 1.00%. Products obtained have high power generation capacity and high quality, and can meet high-standard yield requirements. When the thickness of the flat section 52 is less than 0.08 mm, on the one hand, the process is more difficult, and on the other hand the flat section 52 is too thin and has excessive large internal stress, and thus is prone to fracture and damage.

Based on the above analysis, when the stack-welded module adopts the above-mentioned sectioned structure design, the solder strip 2 is a thin solder strip, the reflective section 50 has a small thickness, and the flat section 52 is fully flattened and sandwiched in the overlapping region between the two stacked solar cells 1a, which is beneficial to reducing the total thickness of the two solar cells 1a in the overlapping regions, and resulting in lower deformation level and risks of micro-crack to the solar cell 1a, thereby reducing the requirement for the thickness of the protective adhesive layer 2. Therefore, in the implementation of this design, the ratio of the first thickness to the thickness of the protective adhesive layer 2 should be not less than 5% and not greater than 15%, or the gram weight of the protective adhesive layer 2 is optionally within a range of 245 $g/m^2$ to 430 $g/m^2$. For example, a ratio of a minimum thickness of the adhesive layer to the thickness of the protective adhesive layer may be 5%, 6%, 7%, 8%, 9%, 10%, 11%, 12%, 13%, 14%, 15%, or the like.

In some of the embodiments, the reflective section 50 can efficiently reflect the light incident on its surface to the front surface of the solar cell 1 for full utilization, and the cross section of the reflective section 50 can be of various shapes, such as triangle, trapezoid, circle or various forms of polygons. Embodiments of the present disclosure only take a circular solder strip as an example for detailed illustration, and the circular solder strip 5a is used to connect two adjacent solar cells 1a. In this case, the diameter size of the solder strip 5a refers to the thickness and width values of the solder strip 5a.

Figure 9:
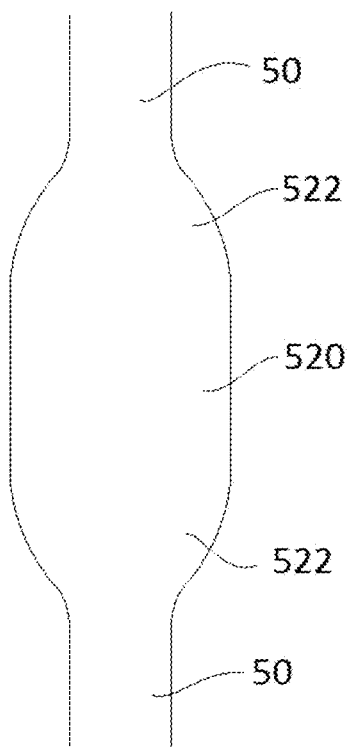
FIG. 9 is a schematic partial structural diagram of a solder strip according to the first embodiment of the present disclosure.
Figure 10:
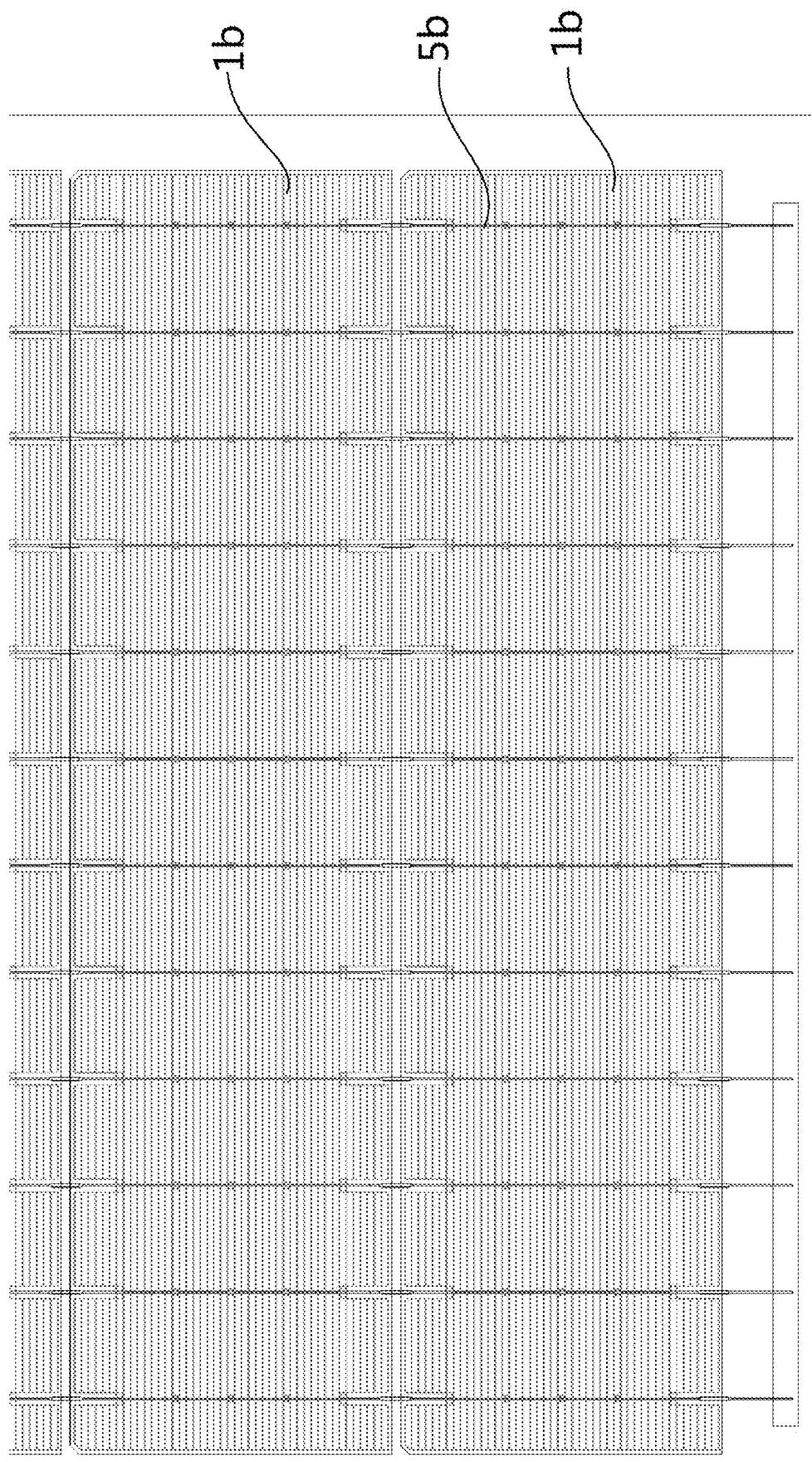
FIG. 10 is a schematic partial structural diagram of a photovoltaic module according to a second embodiment of the present disclosure.
Figure 11:
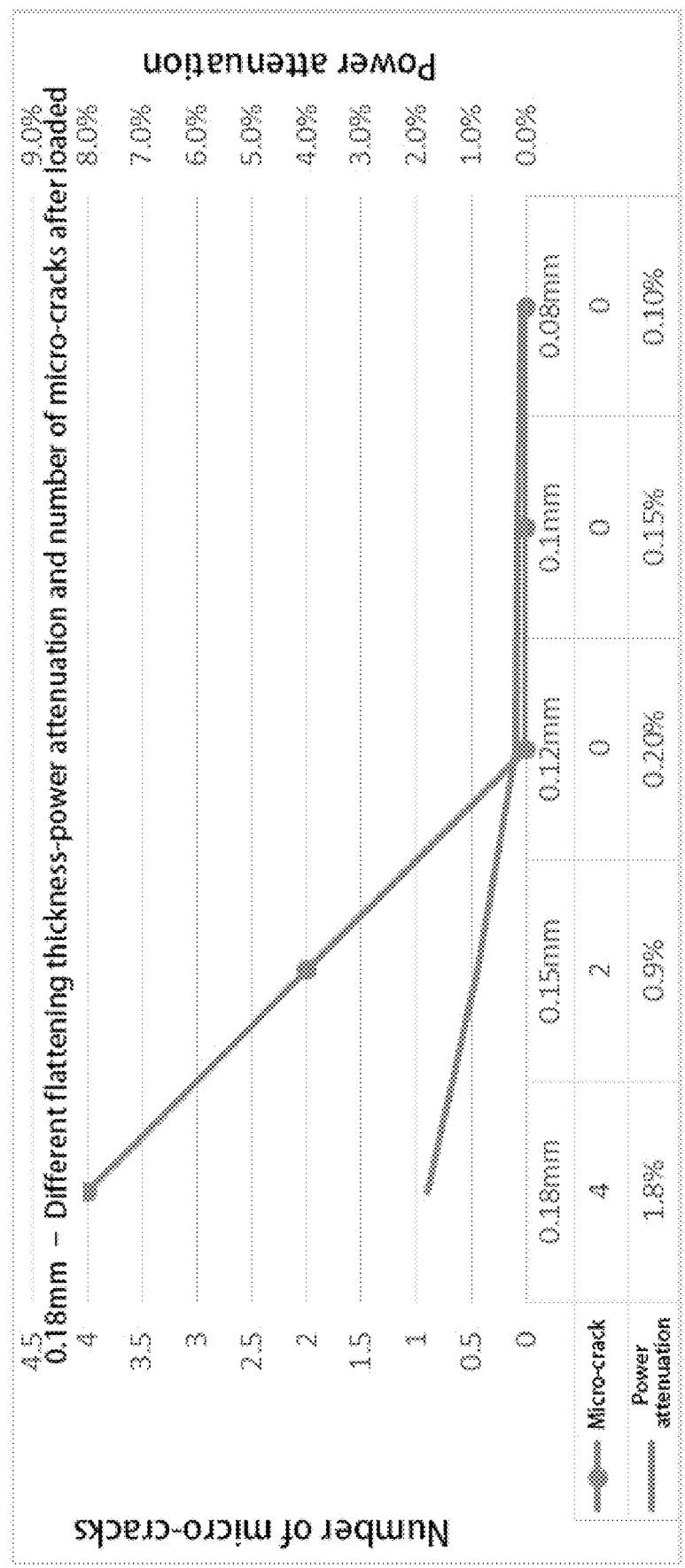
FIG. 11 is a broken line diagram drawn based on data in Table 2.
Figure 12:
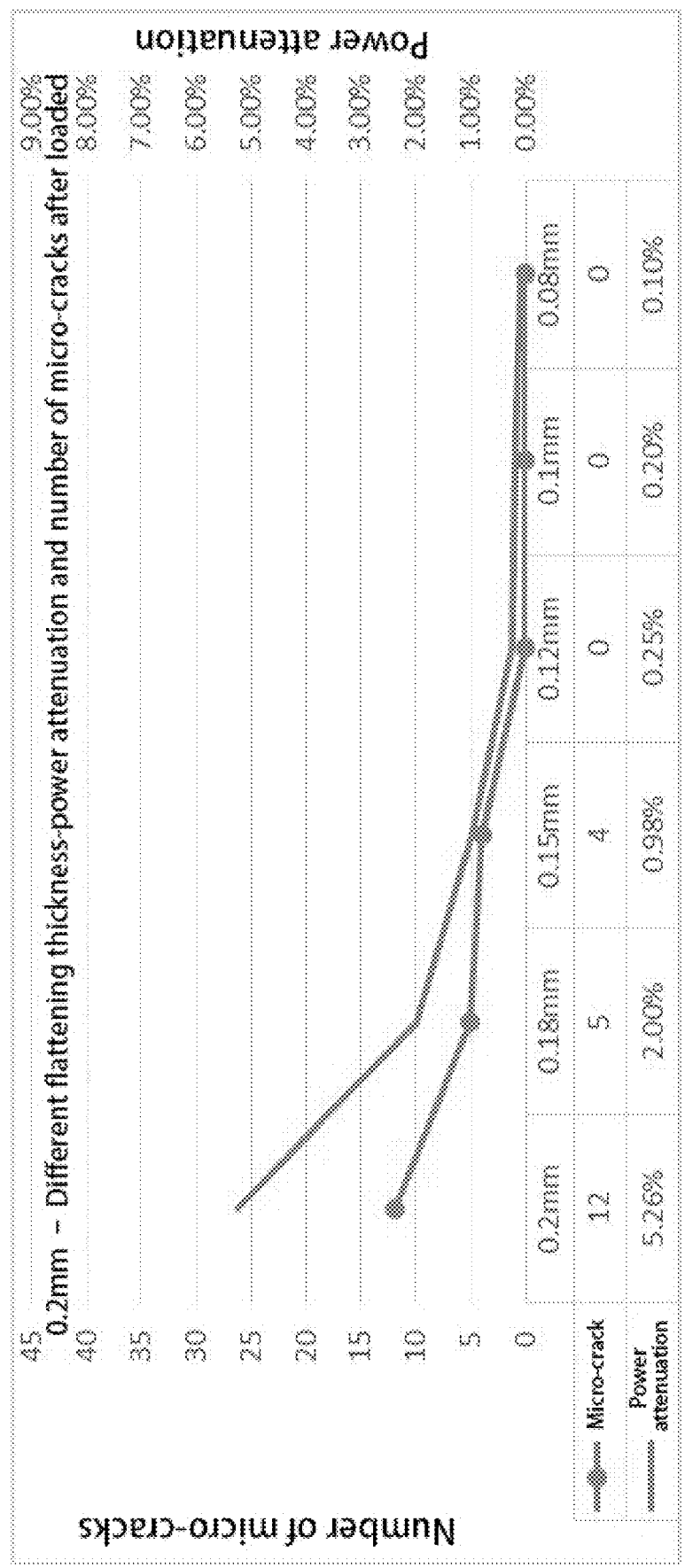
FIG. 12 is a broken line diagram drawn based on data in Table 3.
Figure 13:
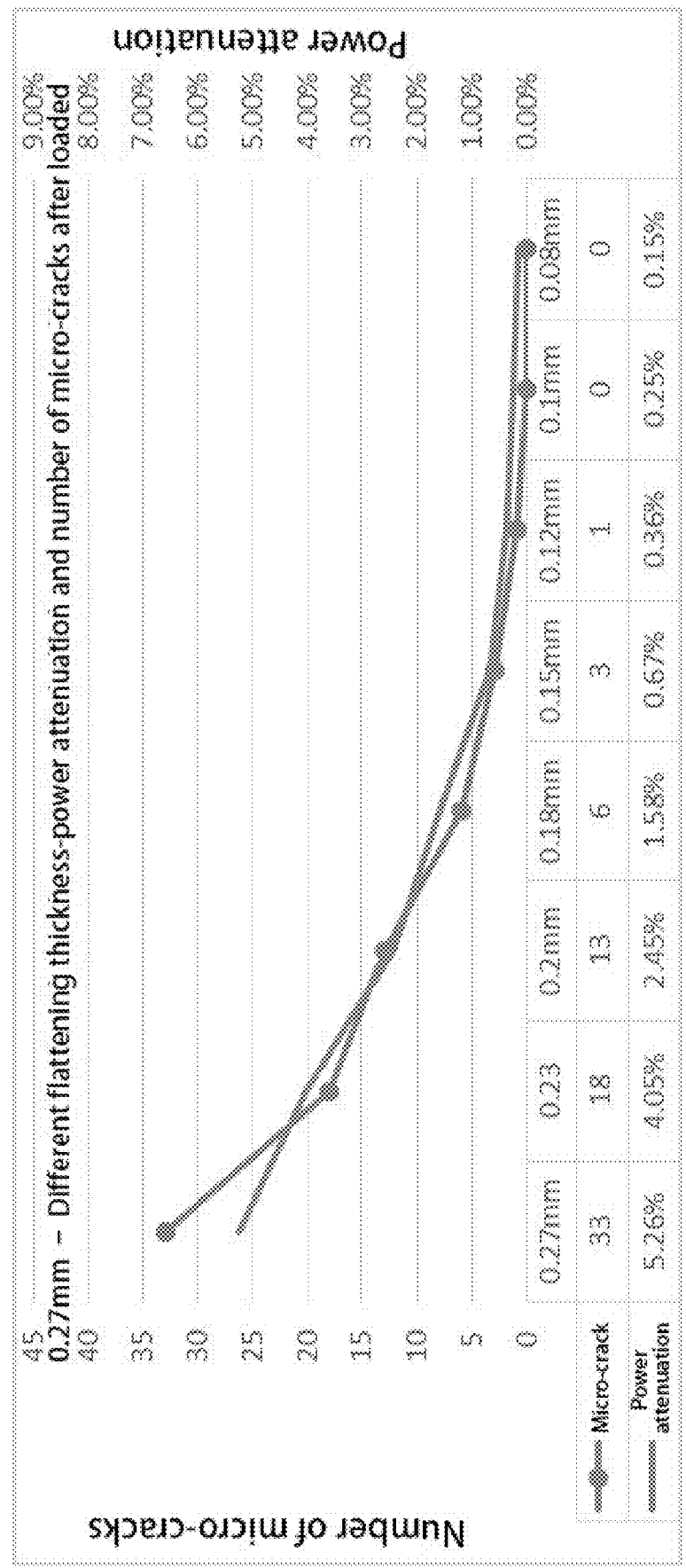
FIG. 13 is a broken line diagram drawn based on data in Table 4.
Figure 14:
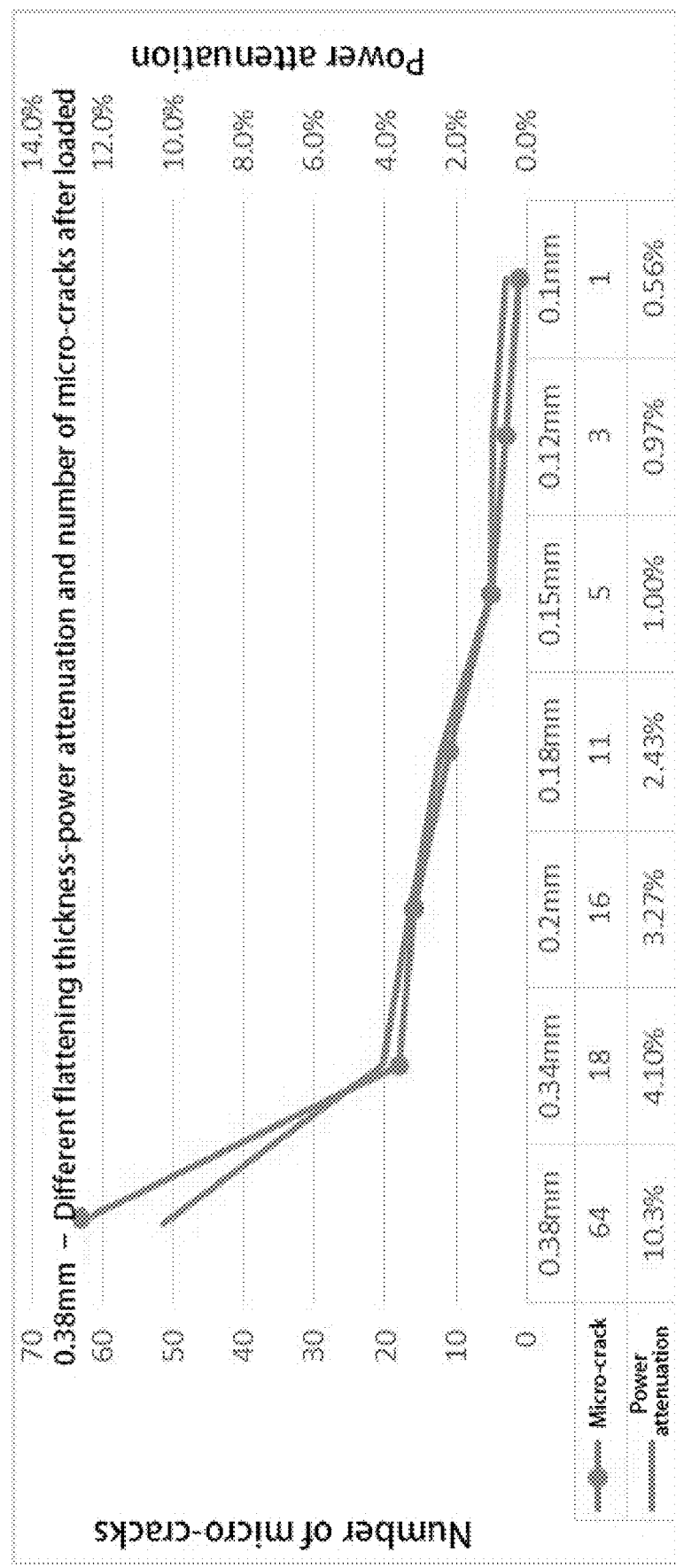
FIG. 14 is a broken line diagram drawn based on data in Table 6.

Referring to FIG. 9, the flat section includes a body 520 and a transitional section 522 connecting the body 520 and the reflective section together. A thickness of the transitional section 522 gradually increases in a direction from the body 520 directed to the reflective section. Widthwise sides of the transitional section 522 are of an arc shape in smooth transition and protruding away from the transitional section 522. A length of the transitional section 522 is within a range of 1 mm to 3 mm, and a length of the body 520 is within a range of 3 mm to 6 mm. When the reflective section and the flat section change drastically in thickness and are tend to bend, break and scrap when subjected to the pressure in the thickness direction during lamination, and the reflective section easily extends into the overlapping region, causing micro-cracks in the solar cell. In this embodiment, by arranging the transitional section 522 of an appropriate length, the body 520 and the reflective section have a proper and natural transitional distance and thickness, and the transitional section 522 protruding outward increases the connection area between the body 520 and the reflective section. The combination of these two aspects can prevent the module from being scraped due to the breakage between the reflective section and the flat section during the lamination process of the module. Moreover, the length of the transitional section 522 is within a range of 1 mm to 3 mm, and the length of the body 520 is larger (in a range of 3 mm to 6 mm). Based on the size design of a specific length, the transitional section 522 is located outside the overlapping region, thus avoiding influencing the stress in the overlapping region. Even if the transitional section 522 extends into the overlapping region due to process reasons, since the thickness of the transitional section 522 gradually increases in the direction from the body 520 directed to the reflective section, the influence on the stress subjected by the overlapping region of the solar cell is also relatively small, which can avoid micro-cracks in the solar cell as much as possible.

In an embodiment, in the case of adopting the transitional section 522 including the body 520 and connecting the body 520 and the reflective section 50, a thickness increasing rate of the transitional section 522 gradually increases in the direction from the body 520 directed to the reflective section 50. The thickness increasing rate refers to the increase of the thickness of the transitional section 522 per unit length of movement in the direction from the body 520 directed to the reflective section 50. With this arrangement, the thickness of a part on the transition section 522 near the body 520 changes more slowly along a length direction of the solder strip. Even if the transition section 522 extends into the overlapping region due to process control and other reasons, there is almost no influence on the stress subjected by the overlapping region of the solar cell, which can avoid micro-cracks in the solar cell as much as possible.

In an embodiment, a ratio of the width of the flat section 52 to the diameter of the reflective section 50 is within a range of 150% to 250%. For example, the ratio of the width of the flat section 52 to the diameter of the reflective section 50 may be 150%, 160%, 170%, 180%, 190%, 200%, 210%, 220%, 230%, 240%, 250%, or the like, which can effectively increase the supporting area without causing micro-cracks in the solar cell due to ultra-large internal stress because of the too high flattening degree of the solder strip 5a. When the ratio of the width of the flat section 52 to the diameter of the reflective section 50 is less than 150%, the width of the flat section 52 is too small, and as a result there is still a large pressure between the solder strip 5a and the solar cell 1a during the lamination process of the module, thus causing a high probability of micro-cracks in the solar cell. When the ratio of the width of the flat section 52 to the diameter of the reflective section 50 is greater than 250%, the flattening degree of the flat section 52 is too high, resulting in a damage due to the excessive internal stress of the flat section 52.

In some of the embodiments, the diameter of the reflective section 50 is 0.18 mm, the width of the flat section 52 can be 0.34 mm, and the ratio of the width of the flat section 52 to the diameter of the reflective section 50 is 186.25%. The diameter of the reflective section 50 is 0.2 mm, the width of the flat section 52 can be 0.41 mm, and the ratio of the width of the flat section 52 to the diameter of the reflective section 50 is 204.93%. The diameter of the reflective section 50 is 0.22 mm, the width of the flat section 52 can be 0.40 mm, and the ratio of the width of the flat section 52 to the diameter of the reflective section 50 is 182.54%. The diameter of the reflective section 50 is 0.25 mm, the width of the flat section 52 can be 0.51 mm, and the ratio of the width of the flat section 52 to the diameter of the reflective section 50 is 204.93%. The diameter of the reflective section 50 is 0.26 mm, the width of the flat section 52 can be 0.55 mm, and the ratio of the width of the flat section 52 to the diameter of the reflective section 50 is 212.46%. The diameter of the reflective section 50 is 0.28 mm, the width of the flat section 52 can be 0.64 mm, and the ratio of the width of the flat section 52 to the diameter of the reflective section 50 is 227.58%. The diameter of the reflective section 50 is 0.3 mm, the width of the flat section 52 can be 0.61 mm, and the ratio of the width of the flat section 52 to the diameter of the reflective section 50 is 204.93%. The diameter of the reflective section 50 is 0.32 mm, the width of the flat section 52 can be 0.70 mm, and the ratio of the width of the flat section 52 to the diameter of the reflective section 50 is 217.49%. The diameter of the reflective section 50 is 0.35 mm, the width of the flat section 52 can be 0.77 mm, and the ratio of the width of the flat section 52 to the diameter of the reflective section 50 is 219.42%. The diameter of the reflective section 50 is 0.38 mm, the width of the flat section 52 can be 0.84 mm, and the ratio of the width of the flat section 52 to the diameter of the reflective section 50 is 221.09%.

In an embodiment, the thickness of the flat section 52 is designed to be less than the thickness of the solar cell 1a, so that the gap between the solar cells 1a is small relative to the thickness of the solar cell 1a, thereby reducing the risk of micro-cracks in the overlapping region of the solar cell 1a.

In an embodiment, the cross section of the flat section 52 is a cashew-shaped surface, and the cashew-shaped surface is defined by planar regions on both sides of the solder strip in a thickness direction and arc-shaped regions on both sides of the solder strip in a width direction. The planar region in the center of the cashew-shaped surface is in contact with the solar cell 1a to form a larger contact area, thereby reducing the pressure generated by the solder strip 5a on the solar cell 1a in total. The arc-shaped regions are formed at two ends of the cashew-shaped surface to avoid the formation of a sharp bevel angle on the solder strip 5a. For example, some solder strips are pre-arranged in a shaping groove during production and processing, their cross sections become rectangular after rapid flattening, sharp angles are formed in the regions on both sides at parts in contact with the planar region and the transition between the regions on both sides and the planar region is not smooth, which easily leads to stress concentration. In this embodiment, the arc-shaped regions are formed on the two sides of the cashew-shaped surface, and an arc-shaped surface is more prone to deformation under a load and has the effect of buffering stress. The transition angle between the arc-shaped region and the planar region is an obtuse angle in smooth transition. Therefore, during lamination, when the solar cell comes into contact with the transitional part of the solder strip, the pressure is small, and the solder strip 5a is prevented from generating an excessive pressure in a local region of the solar cell 1a, thereby effectively reducing the risk of micro-cracks in edges or the overlapping region of the solar cell 1a.

According to an actual test, when the same solder strips 5a are flattened to the same thickness, their flattened cross sections are different, and they are also different in power attenuation and the number of micro-cracks. That is, the photovoltaic module using the solder strip with a cashew-shaped cross section has lower power attenuation and less micro-cracks than a photovoltaic module using the solder strip with a rectangular cross section. Therefore, in the present disclosure, the cross section of the solder strip is flattened and shaped into a cashew-shaped surface, which can reduce the power attenuation and micro-cracks of the photovoltaic module.

In an embodiment, when the circular solder strip 5a is flattened, a pressure only needs to be applied to the upper and lower surfaces of the solder strip 5a, so that the upper and lower surfaces of the solder strip 5a form planar regions. No pressure needs to be applied to the left and right sides of the solder strip 5a. By controlling a lower pressing speed, the arc-shaped regions are formed on the left and right surfaces of the solder strip 5a and are in smooth transition with the planar surfaces, thereby flattening the solder strip 5a into a cashew-shaped surface. Alternatively, a mold can be prefabricated, a cavity of the mold is consistent with the outer contours of the reflective section and the flat section, and a softened solder strip blank or a molten solder strip material is embedded in the mold, and after the softened solder strip blank or the molten solder strip material is cooled, the mold is removed and the solder strip of a desired shape is formed.

In an embodiment, after the solder strip 5a is flattened, along the length direction of the solder strip 5a, the solder strip 5a can be in the shape of a broken line (see FIG. 5), that is, the two planar regions of the flat section 52 are respectively tangent to one sides the two adjacent reflective sections 50 facing the solar cell 1a, so that the surface of the reflective section 50 and the surface of the flat section 52 are aligned on the side close to the solar cell 1a. When the two adjacent solar cells are connected by the solder strip 5a, one planar region of the flat section 52 can be attached to the front surface of the solar cell 1a together with the reflective section 50 at one end, and the other planar region of the flat section 52 can be attached to the back surface of the other solar cell 1a together with the reflective section 50 at the other end. As a result, there is no gap between the flat section 52 and the solar cell 1a, thus minimizing the gap in the overlapping region of two adjacent solar cells 1a and reducing the risk of micro-cracks in the solar cell. In addition, since the two planar regions of the flat section 52 can be attached to the surfaces of the solar cells 1a, the solder strip 5a is hardly deformed during the lamination process, which further reduces the risk of micro-cracks in the solar cell 1a when contacting with the solder strip 5a.

In an embodiment, the thickness of a tin layer on a surface of the reflective section 50 is within a range of 0.013 mm to 0.018 mm. For example, the thickness of the tin layer on the surface of the reflective section 50 may be 0.013 mm, 0.014 mm, 0.015 mm, 0.016 mm, 0.017 mm, 0.018 mm, or the like. In this case, the requirement for welding between the solder strip 5a and the solar cell 1 can be met, Moreover, the thickness of the tin layer on the surface of the solder strip will not be greatly changed during the welding, and thus no adverse effect will be caused on the surface quality of the solder strip 5a. When the thickness of the tin layer on a surface of the reflective section 50 is less than 0.013 mm, the tin layer on the surface of the solder strip 5a is too thin, which affects the reliable connection between the solder strip 5a and the solar cell 1. When the thickness of the tin layer on a surface of the reflective section 50 is greater than 0.018 mm, the tin layer on the surface of the solder strip 5a is too thick. During welding, the tin layer on the surface of the solder strip 5a is molten and flows and thus is redistributed on the surface of the solder strip 5a, resulting in changes in the surface structure of the solder strip 5a and formation of an uneven structure, and thus the solar cell 1 is prone to micro-cracks when it comes into contact with the uneven structure.

In an embodiment, the thickness of the tin layer on a surface of the planar region of the flat section 52 is greater than that in the arc-shaped region and is valued within a range of 0.009 mm to 0.010 mm. The thickness of the tin layer on the surface of the planar region is at least greater than that in the arc-shaped region, which can ensure that the surface of the planar region has a sufficient amount of tin, and the tin can be molten at a high temperature and firmly connected with the busbar during welding, so as to meet the requirement for welding. For example, the thickness of the tin layer on a surface of the flat section 52 may be 0.009 mm, 0.0091 mm, 0.0092 mm, 0.0093 mm, 0.0094 mm, 0.0095 mm, 0.0096 mm, 0.0097 mm, 0.0098 mm, 0.0099 mm, 0.010 mm, or the like, in order to minimize the thickness of the tin layer on a surface of the flat section 52. In this way, the fluidity of the heated and molten tin layer on the surface of this region is reduced during welding, the structural changes, unevenness and the overall thickness change of the solder strip 5a caused by the flow of the tin layer are reduced, and the contact between the solar cell 1 and uneven surfaces of the flat sections 52 can be reduced as much as possible, thereby reducing the risk of micro-cracks in the solar cell 1. When the thickness of the tin layer on a surface of the flat section 52 is greater than 0.010 mm, there will still be an obvious tin layer flow in this region, resulting in the formation of an uneven structure in the planar region of the solder strip 5a, and thus the solar cell 1 is prone to micro-cracks when it comes into contact with the uneven structure.

In some embodiments, an example where the thickness of the tin layer on a surface of the reflective section 50 is 0.015 mm is described here. The thicknesses of the tin layer on a surface of the flat section 52 corresponding to the solder strips of different diameters are as follows: when the diameter of the reflective section 50 is 0.18 mm, the thickness of the tin layer on a surface of the flat section 52 is 0.0102 mm; when the diameter of the reflective section 50 is 0.2 mm, the thickness of the tin layer on a surface of the flat section 52 is 0.0096 mm; when the diameter of the reflective section 50 is 0.22 mm, the thickness of the tin layer on a surface of the flat section 52 is 0.0105 mm; when the diameter of the reflective section 50 is 0.25 mm, the thickness of the tin layer on a surface of the flat section 52 is 0.0097 mm; and when the diameter of the reflective section 50 is 0.27 mm, the thickness of the tin layer on a surface of the flat section 52 is 0.0095 mm.

In an embodiment, when the circular cross section is flattened into a cashew-shaped surface, the cross-sectional area of the solder strip 5a does not change, but the circumference of the cashew-shaped surface is greater than that of the circular surface. Therefore, flattening the solder strip 5a can reduce the thickness of the tin layer on the surface. Moreover, in the flattening process, the tin layer on the surface of the solder strip 5a will be redistributed and gathered to the planar region.

In the embodiments of the present disclosure, the thickness of the tin layer is observed under an electron microscope or an optical microscope after the solder strip is cut off.

In another embodiment, the diameter of the reflective section 50 is within a range of 0.3 mm to 0.4 mm. For example, the diameter of the reflective section 50 may be 0.3 mm, 0.31 mm, 0.32 mm, 0.33 mm, 0.34 mm, 0.35 mm, 0.36 mm, 0.37 mm, 0.38 mm, 0.39 mm, 0.4 mm, or the like; the thickness of the flat section 52 is within a range of 0.12 mm to 0.15 mm. For example, the thickness of the flat section 52 may be 0.12 mm, 0.13 mm, 0.14 mm, 0.15 mm, or the like. For example, the diameter of the reflective section 50 is 0.32 mm and the thickness of the flat section 52 is 0.12 mm; the diameter of the reflective section 50 is 0.35 mm and the thickness of the flat section 52 is 0.13 mm; the diameter of the reflective section 50 is 0.38 mm and the thickness of the flat section 52 is 0.14 mm. Based on this design, the solder strip 5a is relatively thick, which may easily penetrate through the protective adhesive layer has a relatively high requirement for the thickness of the protective adhesive layer 2. Therefore, in the implementation of this design, the ratio of the first thickness to the thickness of the protective adhesive layer 2 should be not less than 10% and not greater than 20%, or the gram weight of the protective adhesive layer 2 is optionally within a range of 430 g/m² to 610 g/m². For example, a ratio of a minimum thickness of the adhesive layer to the thickness of the protective adhesive layer may be 10%, 12%, 14%, 16%, 18%, 20% or the like.

The solar cell string according to the embodiment of the present disclosure includes a plurality of solar cells 1a and a plurality of solder strips 5a. The solar cell 1a is provided busbars 6a (see FIG. 4); the plurality of parallel solder strips 5a are laid on a plurality of parallel busbars 6 of the solar cells 1a. The solder strip 5a is connected to the busbars on a front surface of one of the solar cells 1a and to the busbars on a back surface of the other solar cell 1a, thus connecting two adjacent solar cells 1a together.

In an embodiment, during the production design, the adhesive film may be selected first and then is matched with a suitable solder strip 5a. For example, the gram weight of the adhesive film is within a range of 230 g/m² to 610 g/m². Typically, but not restrictively, the gram weight of the adhesive film can be 230 g/m², 250 g/m², 260 g/m², 275 g/m², 300 g/m², 320 g/m², 355 g/m², 370 g/m², 390 g/m², 415 g/m², 440 g/m², 450 g/m², 480 g/m², 500 g/m², 515 g/m², 530 g/m², 560 g/m, 610 g/m², or the like, so that the thickness of the protective adhesive layer 2 can fall within an appropriate thickness range. When the gram weight of the protective adhesive layer 2 is less than 230 g/m², the protective adhesive layer 2 is too thin, and accordingly the solder strip 5a is too thin to meet a current load requirement; and when the gram weight of the protective adhesive layer 2 is greater than 610 g/m², the protective adhesive layer 2 is too thick, and as a result the protective adhesive layer 2 can hardly be fully molten, which also affects the adhesion effect and will increase the pressure required during lamination and increase the risk of micro-cracks in the solar cell.

Corresponding to the above gram weight, the thickness of the film is within a range of 0.24 mm to 0.63 mm; for example, the thickness of the film can be 0.25 mm, 0.26 mm, 0.27 mm, 0.29 mm, 0.31 mm, 0.33 mm, 0.37 mm, 0.39 mm, 0.41 mm, 0.43 mm, 0.44 mm, 0.45 mm, 0.46 mm, 0.47 mm, 0.48 mm, 0.49 mm, 0.5 mm, 0.51 mm, 0.52 mm, 0.53 mm, 0.54 mm, 0.55 mm, 0.56 mm, 0.57 mm, 0.58 mm, 0.59 mm, 0.6 mm, 0.61 mm, 0.62 mm, 0.63 mm, or the like.

In order to show that the solar cell string of the embodiments of the present disclosure has the effect of reducing the risk of micro-cracks in the solar cell, circular solder strips and solder strips that have been flattened to different degrees are now applied to photovoltaic modules for comparison experiments. The results of the comparison experiments are shown in Table 2 to Table 6. In each experimental table, apart from the different flattening degrees of the solder strips, other parameters (such as the thickness of the solar cell, the type and thickness of the adhesive film) of various groups of photovoltaic modules of the embodiments are the same. For example, the front plate is made of 3.2 mm thick glass, 500 g/m² EVA is used for the adhesive film, the thickness of the solar cell is 0.18 mm, the thickness of the back plate is 0.3 mm, and other experimental conditions are also the same. Each sample number represents a group of sample photovoltaic modules, and the corresponding experimental results are the average values of the experimental results of the corresponding group of sample photovoltaic modules. A specific experimental method is described as follows:

According to the requirements of IEC61215, the mechanical load test includes static mechanical load test and dynamic mechanical load test.

The static mechanical load test is usually performed by applying a pressure of 5400 Pa to the front surface of a module for one hour, then turning the module over and applying a pressure of 2400 Pa for one hour, and repeating the above operations for three times. After the test is completed, the appearance, IV and wet leakage performance of the models are tested.

The dynamic mechanical load test is performed as follows. The modules are subjected to 1000 alternating loading cycles under a pressure of 1000 Pa. Next, the modules are placed in an environmental simulation room to undergo 50 thermal cycles (at a temperature of −40° C. to 85° C.) for micro-crack propagation, and then undergo 10 humidity freezing cycles (at a temperature of 85° C. and a relative humidity of 85%) for 20 hours, then quickly cooled to −40° C., thereby stimulating potential corrosion.

After each step, the modules are characterized and visually inspected for any signs of failure. After the test is completed, the appearance, IV (power test) and wet leakage performance of the modules are tested.

TABLE 2

Load test of 0.18 mm solder strip

| Solder strip of 0.18 mm | Proportion % | Thickness of the flat section of the solder strip | Power attenuation | Number of micro-cracks |
|---|---|---|---|---|
| 1# | 100% | 0.18 mm | 1.80% | 4 |
| 2# | 83.3% | 0.15 mm | 0.90% | 2 |
| 3# | 66.6% | 0.12 mm | 0.20% | 0 |
| 4# | 55.6% | 0.1 mm | 0.15% | 0 |
| 5# | 44.4% | 0.08 mm | 0.10% | 0 |

TABLE 3

Load test of 0.2 mm solder strip

| Solder strip of 0.2 mm | Proportion % | Thickness of the flat section of the solder strip | Power attenuation | Number of micro-cracks |
|---|---|---|---|---|
| 1# | 100% | 0.20 mm | 5.26% | 12 |
| 2# | 90% | 0.18 mm | 2.00% | 5 |
| 3# | 75% | 0.15 mm | 0.98% | 4 |
| 4# | 60% | 0.12 mm | 0.25% | 0 |
| 5# | 50% | 0.1 mm | 0.20% | 0 |
| 6# | 40% | 0.08 mm | 0.10% | 0 |

TABLE 4

Load test of 0.27 mm solder strip

| Solder strip of 0.27 mm | Proportion % | Thickness of the flat section of the solder strip | Power attenuation | Number of micro-cracks |
|---|---|---|---|---|
| 1# | 100% | 0.27 mm | 7.00% | 33 |
| 2# | 85% | 0.23 mm | 4.05% | 18 |
| 3# | 74% | 0.2 mm | 2.45% | 13 |
| 4# | 66.7% | 0.18 mm | 1.58% | 6 |

TABLE 4-continued

Load test of 0.27 mm solder strip

| Solder strip of 0.27 mm | Proportion % | Thickness of the flat section of the solder strip | Power attenuation | Number of micro-cracks |
|---|---|---|---|---|
| 5# | 55.6% | 0.15 mm | 1.00% | 4 |
| 6# | 44.4% | 0.12 mm | 0.36% | 1 |
| 7# | 37% | 0.1 mm | 0.25% | 0 |
| 8# | 29.6% | 0.08 mm | 0.15% | 0 |

TABLE 5

Load test of 0.3 mm solder strip

| Solder strip of 0.3 mm | Proportion % | Thickness of the flat section of the solder strip | Power attenuation | Number of micro-cracks |
|---|---|---|---|---|
| 1# | 100% | 0.3 mm | 6.4% | 41 |
| 2# | 90% | 0.27 mm | 4.80% | 17 |
| 3# | 66.7% | 0.2 mm | 2.65% | 15 |
| 4# | 60.0% | 0.18 mm | 1.73% | 8 |
| 5# | 50.0% | 0.15 mm | 0.88% | 4 |
| 6# | 40.0% | 0.12 mm | 0.45% | 2 |
| 7# | 33.3% | 0.1 mm | 0.31% | 1 |

TABLE 6

Load test of 0.38 mm solder strip

| Solder strip of 0.38 mm | Proportion % | Thickness of the flat section of the solder strip | Power attenuation | Number of micro-cracks |
|---|---|---|---|---|
| 1# | 100% | 0.38 mm | 10.3% | 64 |
| 2# | 90% | 0.34 mm | 4.10% | 18 |
| 3# | 52.6% | 0.2 mm | 3.27% | 16 |
| 4# | 47.3% | 0.18 mm | 2.43% | 11 |
| 5# | 39.4% | 0.15 mm | 1.00% | 5 |
| 6# | 31.6% | 0.12 mm | 0.97% | 3 |
| 7# | 26.3% | 0.1 mm | 0.56% | 1 |

According to the data in Table 2, Table 3, Table 4 and Table 6, broken line diagrams are drawn as shown in FIG. 11 to FIG. 14. According to the data in Table 2, Table 3, Table 4 and Table 6, and in conjunction with FIG. 11 to FIG. 14, the following can be seen. By flattening the solder strip, the power attenuation of the photovoltaic module can be reduced, and the number of micro-cracks in the solar cell can be reduced. With the increase in the flattening degree of the solder strip, the power attenuation of the photovoltaic module gradually decreases, and the number of micro-cracks of the solar cell also gradually decreases. However, when the flattening degree of the solder strip is too high, the solder strip is further flattened, and the broken line diagrams tends to be flat, that is to say, the power attenuation and the number of micro-cracks will not change significantly. Therefore, in this embodiment, the thickness of the flattened solder strip is in a range of 29.6% to 83.3% of the diameter of the solder strip.

Embodiment 2

In the second embodiment, a solar cell 1b and another solar cell 1b in the solar cell string are spaced apart from each other, that is, there is a space between two adjacent solar cells 1b, and the two adjacent solar cells 1b are connected by a plurality of solder strips 5b arranged side by side.

The number of solder strips 5b in the photovoltaic module can be within a range of 11 to 18. For example, the number of solder strips for photovoltaic module can be 11, 12, 13, 14, 15, 16, or 18. In other words, in the solar cell string of this embodiment, adjacent solar cells may be connected by a plurality of (11 or more) solder strips 5b arranged side by side. Solar cells with a plurality of busbars are described as an example. The solder strips 5b are respectively laid on the corresponding busbars. As the number of solder strips increases, the solar cell area on both sides of each solder strip 5b is smaller, and a single solder strip 5b collects less current. Therefore, the use of the thinner solder strip can ensure safe current collection.

There should be a reasonable match between the number of solder strips and the thickness size of the solder strip. For example, the number of solder strips is 11 and the size of the solder strip is 0.27 mm; the number of solder strips is 12 and the size of the solder strip is 0.26 mm; the number of solder strips is 13 and the size of the solder strip is 0.25 mm; the number of solder strips is 14 and the size of the solder strip is 0.24 mm; the number of solder strips is 15 and the size of the solder strip is 0.22 mm; the number of solder strips is 16 and the size of the solder strip is 0.2 mm; and the number of solder strips is 18 and the size of the solder strip is 0.18 mm.

During production, the selected solder strip 5b can be matched with a film with an appropriate thickness in advance. For example, the thickness of the solder strip 5b is preferably within a range of 0.18 mm to 0.27 mm. The thinner solder strip can meet the current load requirements, and reduce the micro-cracks in the solar cell 1a caused during the lamination of the photovoltaic module. During matching, when the thickness of the solder strip 5b can be within a range of 0.18 mm to 0.27 mm, a ratio of a second thickness (a difference between the thickness of the adhesive film and the thickness of the solder strip) to the thickness of one adhesive film is within a range of 25% to 35%. For example, the ratio of the minimum thickness of the adhesive layer to the thickness of the protective adhesive layer can be 25%, 26%, 27%, 28%, 29% or 30%, 31%, 32%, 33%, 34%, 35% or the like. Within this range, a better thickness range can be defined. According to Table 7 and Table 8, this range is sufficient to meet high-standard production requirements, the power attenuation of the prepared photovoltaic module is not greater than 1%, the number of micro-cracks is very small, and there is no need to further increase the thickness of the film when the ratio goes beyond the range of greater than 35%. Therefore, choosing a thinner film and forming a thinner protective film can effectively protect the solar cell. The thickness of the adhesive film after lamination is reduced by 25% to 30%, and in combination with the actual production detection results, a ratio of the first thickness of the protective adhesive layer 2 formed by pressing to the thickness of the protective adhesive layer 2 can be within a range of 0 to 13%.

Further referring to Tables 7 and 8, corresponding to the above ratio, the gram weight of the adhesive film is within a range of 230 g/m² to 400 g/m², for example, the gram weight of the film is 230 g/m², 250 g/m², 255 g/m², 275 g/m², 300 g/m², 335 g/m², 355 g/m², 370 g/m², 380 g/m², 400 g/m², or the like. Within this range, the adhesive film and the solder strip 5b can be appropriately matched in thickness. When the gram weight of the adhesive film is less than 230 g/m², the protective adhesive layer 2 is too thin, resulting in the size of the solder strip 5b being too small to meet the current load requirement.

In an embodiment, the solder strip 5b can be designed as a sectioned structure. In an embodiment, the solder strip 5b includes a reflective section and a flat section which are connected to each other, the reflective section is arranged on a surface of the solar cell, and the flat section is at least partially arranged between two adjacent solar cells 1b (for example, when two solar cells 1b are apart from each other and the solder strip is connected to the two solar cells, the two reflective sections are respectively arranged on a front surface of one of the two solar cells and a back surface of the adjacent one, in this case, the flat section passes between the two solar cells and contacts edges of the solar cells, the pressure applied to the solar cell when the flat structure is in contact with the edge of the solar cell will be reduced). In other words, when a part, between the two adjacent solar cells 1b, of the solder strip 2 is of a flat structure, the pressure of contact with the edge of the solar cell 1b can be reduced, thereby reducing the risk of micro-cracks at the edge of the solar cell 1b. Based on this, and considering the reflective section with a thickness in a range of 0.18 mm to 0.27 mm, the micro-cracks in the surface and edge of the solar cell 1b can be effectively reduced during the lamination of the photovoltaic module.

Therefore, when the photovoltaic module adopts the above-mentioned sectioned design, the -thin solder strip is used, the thickness of the reflective section is small, the part, between the two adjacent solar cells 1b, of the solder strip 2 is of a flat structure, and the thickness of the flat section is within a range of 0.08 mm to 0.15 mm, which can reduce the intensity of pressure during contact with the surface and edge of the solar cell 1b as a whole and will lower the requirement for the thickness of the protective adhesive layer formed. Therefore, a thinner protective adhesive layer can effectively protect the edge of the solar cell. The ratio of the first thickness to the thickness of the protective adhesive layer can be not less than 0% and not greater than 10%, or the gram weight of the protective adhesive layer can be within a range of 230 g/m$^2$ to 380 g/m$^2$.

In some other embodiments, when the diameter of the solder strip 5b is less than 0.18 mm, the solder strip 5b is too thin and is easily fused during use, which affects the normal current collection; and when the diameter of the solder strip 5b is greater than 0.27 mm, the size of the solder strip 5b is too large and a thicker adhesive film needs to be selected, which will increase the production cost of the photovoltaic module.

In some embodiments, the solar cell string provided includes a plurality of solar cells 1b and a plurality of solder strips 5b. The solar cell 1b is provided with busbars. The solar cell 1b can be a square solar cell substrate or N solar cells cut from a solar cell substrate along the extension direction of the busbars, where N≥2. Compared with a large-sized solar cell substrate, the solar cell 1b cut therefrom has a small area. A single small-sized solar cell 1b collects less current, thereby reducing a short-circuit current Isc of the solar cell 1b, reducing a rated current requirement for a junction box in the photovoltaic module, and also reducing the performance requirement for a bypass diode. Therefore, the difficulty and risk in the circuit design of the entire photovoltaic module are lowered and the flexibility of the photovoltaic module design can be greatly improved. Moreover, because of the small-sized solar cell 1b, an output current is reduced, and a current flowing on the solder strip 5b is correspondingly reduced, thereby reducing the power loss of the photovoltaic module on the solder strip 5b and ensuring a relatively high power output for the photovoltaic module.

The plurality of solder strips 5b in this embodiment are laid on a plurality of parallel busbars of the solar cells 1b. The solder strip 5b is connected to the busbars on a front surface of one of the solar cells 1b and to the busbars on a back surface of the other solar cell 1b, thus connecting two adjacent solar cells 1 together. On this basis, due to adoption of N solar cells, a solar cell area on both sides of each solder strip 5b is reduced, so that the current flowing through a single solder strip 5b is reduced, that is, a current load of the solder strip is reduced. In this way, even if the photovoltaic module is equipped with a thinner solder strip 5b with a smaller cross section, the requirement for safe current collection can be meet. Therefore, a thin solder strip with a smaller cross section is used in this embodiment. The use of a thinner solder strip 5b (with a thickness of 0.27 mm or below) can reduce the shielding of the solder strip 5 over the surface of the solar cell 1 and increase generated power. Moreover, since a thinner solder strip 5 applies less pressure to the surface of the solar cell 1, even a thin protective adhesive layer 2 is adopted, a significant protection effect to the solar cell 1 can be realized. As a result, the protective adhesive layer having a thinner thickness can also be adopted, which greatly reduce the production cost.

Compared to the whole piece of solar cell, the use of the N solar cells can achieve the following effect: more solar cells are arranged on the photovoltaic module of the same size. When the solar cells are arranged in sequence, there will be more connecting parts between the solar cells, and there will correspondingly be more parts in contact with the edges of the solar cells when the solder strip passes between the solar cells, and the possibility of micro-cracks in the solar cell will increase. Therefore, a thicker film is required to fully protect the edges of the solar cells. Especially when the solar cells are stacked, there are more overlapping regions, and a thicker film is required to protect the overlapping regions of the solar cells. Therefore, based on the design using N solar cells, the ratio of the first thickness to the thickness of the protective adhesive layer is not less than 5% and not greater than 20%, or the protective adhesive layer has a gram weight of 245 g/m$^2$ to 610 g/m$^2$.

In the case where the solar cells are stacked, the plurality of solar cells 1 are arranged in sequence along the first direction. The solar cell 1 includes a single-layer region and an overlapping region, and adjacent solar cells 1 are stacked in the overlapping region. That is, the solar cells 1 are in a shingled arrangement to reduce a gap between the solar cells 1 so that the total area occupied by the N solar cells 1 is not greater than the area of the solar cell substrate before cutting, thereby ensuring the output efficiency of the module and enhancing the space utilization of a power station.

In an embodiment, the length of the solar cell substrate along the first direction is within a range of 156 mm to 220 mm, for example, the length of the solar cell substrate along the first direction is 156 mm, 160 mm, 165 mm, 170 mm, 175 mm, 180 mm, 185 mm, 190 mm, 195 mm, 200 mm, 205 mm, 210 mm, 215 mm, 220 mm, or the like. Corresponding to the solar cell substrate of the above specifications, 9 to 20 solder strips 5 are arranged side by side on the solar cell substrate, and there are 9 to 20 solder strips 5 on the solar cells cut from the solar cell substrate along the first direction too. For example, there are may be 9, 10, 11, 12, 13, 14, 15, 16, 17, 18, 19, or 20 solder strips on the solar cell string, that is, the solar cell string in this embodiment has more than 9 busbars. As the number of busbars increases, the solar cell area on both sides of each solder strip 5 is smaller, and a single solder strip 5 collects less current and has a lower power load. Therefore, the use of the thin solder strip provided in this embodiment can ensure safe current collection and keep the current collection effect unchanged.

In some of the embodiments, the length of the solar cell substrate along the first direction may be within a range of 156 mm to 170 mm, and the number of solder strips on the solar cell is 10 to 16. In this case, the number of solder strips on the solar cell is relatively small. Under this condition, the thickness of the reflective section of the solder strip 5 may be within a range of 0.20 mm to 0.27 mm.

In other embodiments, the length of the solar cell substrate along the first direction may be within a range of 170 mm to 180 mm, and the number of solder strips on the solar cell substrate is 12 to 18. In this case, the length of the solar cell substrate is increased, and the number of solder strips arranged is larger. When the number of solder strips increases, the solar cell area on both sides of each solder strip 5 is smaller, and a single solder strip 5 collects less current and has a lower power load. Therefore, a thinner solder strip can be used and in this case, an optional thickness of the reflective section can be within a range of 0.18 mm to 0.27 mm.

In still other embodiments, the length of the solar cell substrate along the first direction may be within a range of 180 mm to 220 mm, and in this case, the length of the solar cell substrate is larger, the number of solder strips arranged is further increased, and may be up to 13 to 20. When there are more solder strips, the solar cell area on both sides of each solder strip 5 is relatively small, a single solder strip 5 has a lower power load, and the thickness of the reflective section may be within a range of 0.18 mm and 0.27 mm.

In some embodiments, when there are 1 to 11 solder strips 5b arranged side by side, the solar cell area on both sides of each solder strip 5b increases, the current load borne by the solder strip 5b increases accordingly, and a solder strip with a larger thickness is required, and this will increase the possibility of cracking, and accordingly a thicker protective adhesive layer 2 needs to be formed to protect the solar cell. Therefore, based on this design, the ratio of the first thickness to the thickness of the protective adhesive layer is not less than 10% and not greater than 20%, or the protective adhesive layer has a gram weight of 255 g/m$^2$ to 610 g/m$^2$.

In order to further show that the above-mentioned photovoltaic modules of the embodiments of the present disclosure have the effect of reducing the risk of micro-cracks in the solar cell, matching experiments were carried out on combinations of the solder strips of different sizes and the adhesive films of different thickness. The experimental results are shown in Table 7 and Table 8. In each experimental table, apart from the differences listed in the table, other parameters (such as the thickness of the solar cell, the thickness of the solder strip, and the type of the adhesive film) of various groups of photovoltaic modules of the embodiments are the same, and other experimental conditions are also the same. For example, the front plate is made of 3.2 mm thick glass, the thickness of the solar cell is 0.18 mm, the thickness of the back plate is 0.3 mm, and the lamination process is generally carried out for 360 s at a temperature between 135° C. and 145° C. and under a pressure of −60 Mpa. Table 7 is based on data of the photovoltaic modules using a 0.18 mm solder strip, and Table 8 is based on data of photovoltaic modules using a 0.27 mm solder strip. Each sample number represents a group of sample photovoltaic modules, and the corresponding experimental results are the average values of the experimental results of the corresponding group of sample photovoltaic modules.

TABLE 7

Load test of photovoltaic modules adopting combination of 0.18 mm solder strip with adhesive films of different thicknesses

| Solder strip of 0.18 mm | Gram weight of adhesive film | Adhesive film thickness (mm) | Ratio of the second thickness to the thickness of the adhesive film | Power attenuation | Number of micro-cracks |
|---|---|---|---|---|---|
| | 355 | 0.369 | 51% | 0.60% | 2 |
| | 320 | 0.333 | 46% | 0.60% | 2 |
| | 290 | 0.302 | 40% | 0.50% | 2 |
| | 265 | 0.276 | 35% | 0.70% | 2 |
| | 250 | 0.260 | 31% | 0.80% | 4 |
| | 230 | 0.239 | 25% | 0.90% | 6 |
| | 220 | 0.229 | 21% | 2.20% | 13 |
| | 210 | 0.218 | 18% | 3.00% | 16 |

TABLE 8

Load test of photovoltaic modules adopting combination of 0.27 mm solder strip with adhesive films of different thicknesses

| Solder strip of 0.27 mm | Gram weight of adhesive film | Adhesive film thickness (mm) | Ratio of the second thickness to the thickness of the adhesive film | Power attenuation | Number of micro-cracks |
|---|---|---|---|---|---|
| | 500 | 0.520 | 48% | 3.00% | 5 |
| | 480 | 0.499 | 46% | 1.80% | 2 |
| | 460 | 0.478 | 44% | 0.80% | 2 |
| | 430 | 0.447 | 40% | 0.50% | 0 |
| | 400 | 0.416 | 35% | 0.50% | 0 |
| | 385 | 0.400 | 33% | 0.80% | 1 |
| | 370 | 0.385 | 30% | 0.80% | 3 |
| | 345 | 0.359 | 25% | 1.00% | 8 |
| | 330 | 0.343 | 21% | 2.50% | 15 |
| | 310 | 0.322 | 16% | 4.00% | 20 |

Figure 15:
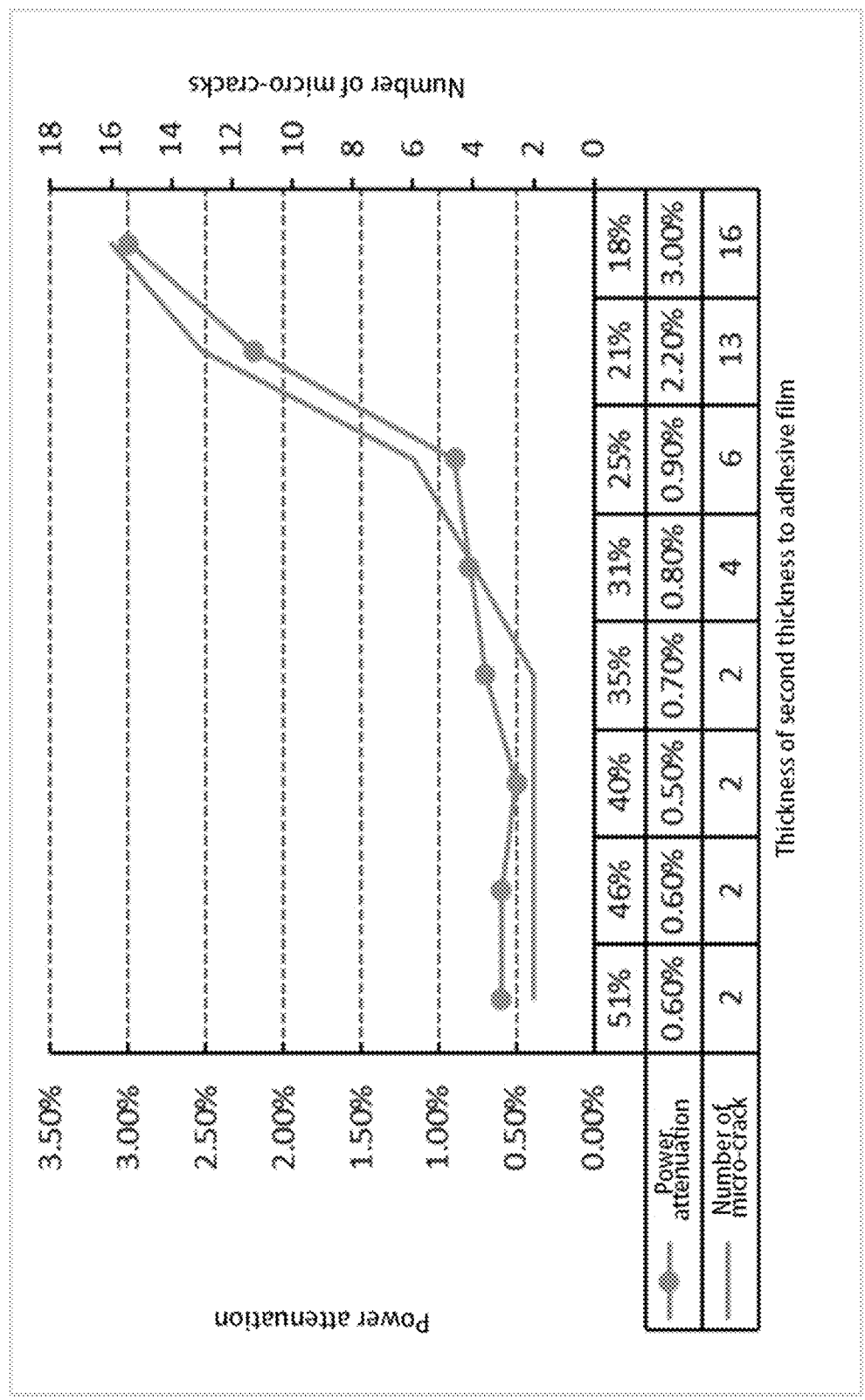
FIG. 15 is a broken line diagram drawn based on data in Table 7.
Figure 16:
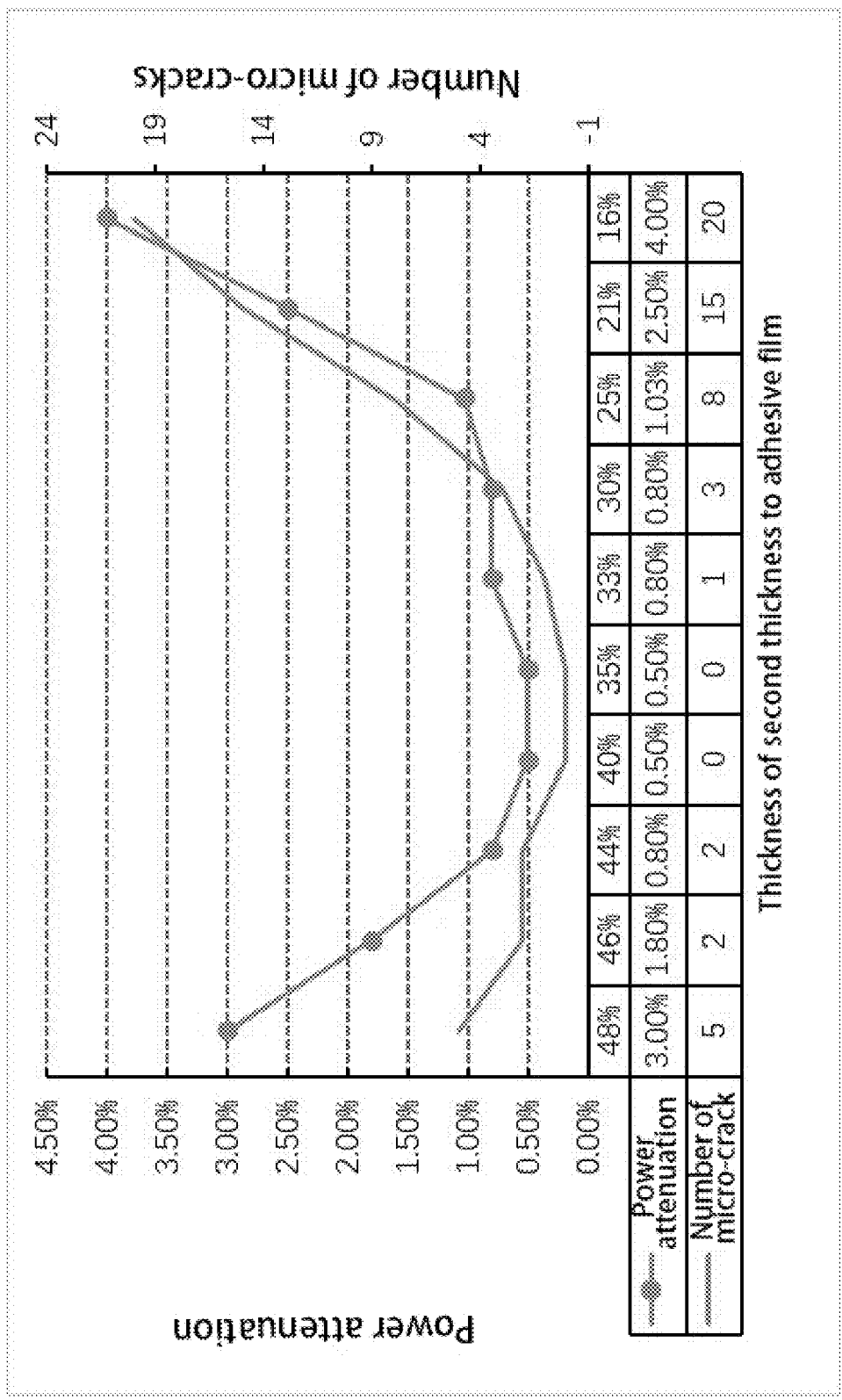
FIG. 16 is a broken line diagram drawn based on data in Table 8.

FIGS. 15 and 16 are drawn according to the data in Table 7 and Table 8. According to the data in Table 7 and Table 8, it can be seen that by limiting the range of the ratio of the second thickness to the thickness of the first adhesive film (that is, the range of the proportion of the adhesive layer going beyond the solder strip), the thickness of the adhesive film and the size of the solder strip can be reasonably matched, thereby reducing the risk of micro-cracks in the solar cell and accordingly reducing the power attenuation of the photovoltaic module. According to the data in Table 7 and FIG. 15, the following can be seen. When the proportion is within a range of 25% to 40%, the number of micro-cracks is not greater than 6, and the power attenuation is not greater than 0.9%. When the proportion is less than 25%, the number of micro-cracks and power attenuation are both significantly increased. When the proportion is greater than 40%, the anti-cracking effect and power attenuation are not decreased obviously, however, the increase in film thickness will increase the cost. According to the data in Table 8 and FIG. 15, the following can be seen. When the proportion is within a range of 25% to 40%, the number of micro-cracks is not greater than 8, and the power attenuation is not greater than 1.0%. When the proportion is less than 25%, the number of micro-cracks and power attenuation are both significantly increased. When the proportion is greater than 40%, the anti-cracking effect and power attenuation are reduced, for the following reason: the adhesive film is too thick, and as a result the adhesive film can hardly be fully heated and molten, which reduces the anti-cracking effect. Moreover, the greater the thickness of the adhesive film used, the higher the pressure required during lamination, which will increase the risk of micro-cracks in the solar cell, and in addition, the increase in thickness will also increase the cost.

The above description shows merely preferred embodiments of the present disclosure and is not intended to limit the present application, and various changes and modifications of the present disclosure may be made by those skilled in the art. Any modifications, equivalents, improvements, etc. made within the spirit and principle of the present disclosure are intended to be included within the scope of the present application.

What is claimed is:

1. A photovoltaic module, comprising:
    a solar cell string comprising a plurality of solar cells, adjacent two of the plurality of solar cells being connected by a solder strip, wherein the solder strip is connected to a front surface of one solar cell and to a back surface of another solar cell, and a long-side size of the solar cell is within a range of 150 mm to 220 mm;
    two protective adhesive layers respectively covering a front surface and a back surface of the solar cell string, wherein a size difference between a thickness of one protective adhesive layer and a thickness of the solder strip is defined as a first thickness, a ratio of the first thickness to the thickness of one protective adhesive layer is not less than 5% and not greater than 15%;
    a transparent plate covering a surface of the protective adhesive layer on the front surface of the solar cell string; and
    a back plate covering a surface of the protective adhesive layer on the back surface of the solar cell string;
    each of the plurality of solar cells comprises a single-layer region and an overlapping region, and adjacent two of the solar cells are stacked in the overlapping region, and the protective adhesive layer has a gram weight of 245 g/m$^2$ to 430 g/m$^2$;
    the solder strip comprises a reflective section and a flat section connected to the reflective section, the reflective section is arranged in the single-layer region, and the flat section is at least partially arranged in the overlapping region; and
    a cross section of the flat section is a cashew-shaped surface, and the cashew-shaped surface is defined by planar regions on both sides of the solder strip in a thickness direction and arc-shaped regions on both sides of the solder strip in a width direction.

2. The photovoltaic module according to claim 1, wherein a thickness of the reflective section is within a range of 0.18 mm to 0.27 mm, and a thickness of the flat section is within a range of 0.08 mm to 0.15 mm.

3. The photovoltaic module according to claim 2, wherein the flat section comprises a body and a transitional section connecting the body and the reflective section together; a thickness of the transitional section gradually increases in a direction from the body directed to the reflective section;
    wherein sides of the transitional section along a width direction are each of an arc shape in smooth transition and protruding away from the transitional section; a length of the transitional section is within a range of 1 mm to 3 mm, and a length of the body is within a range of 3 mm to 6 mm, or
    a thickness increasing rate of the transitional section gradually increases in the direction from the body directed to the reflective section.

4. The photovoltaic module according to claim 2, wherein a width ratio of the flat section to the reflective section is within a range of 150% to 250%.

5. The photovoltaic module according to claim 1, wherein the adjacent solar cells are connected by a plurality of solder strips arranged side by side; a number of solder strips is within a range of 11 to 18, a thickness of the solder strip is within a range of 0.18 mm to 0.27 mm, the ratio of the first thickness to the thickness of the protective adhesive layer is not less than 0% and not greater than 13%.

6. The photovoltaic module according to claim 5, wherein the solder strip comprises a reflective section and a flat section connected to the reflective section, the reflective section is arranged on a surface of the solar cell, and the flat section is at least partially arranged between two adjacent solar cells; a thickness of the flat section is within a range of 0.18 mm to 0.15 mm, and the ratio of the first thickness to the thickness of the protective adhesive layer is not less than 0% and not greater than 10%.

7. The photovoltaic module according to claim 1, wherein the plurality of solar cells comprises N solar cells cut from a solar cell substrate along an extension direction of the solder strip, where N≥2.

8. The photovoltaic module according to claim 1, wherein the adjacent solar cells are connected by a plurality of solder strips arranged side by side, and a number of solder strips is within a region of 1 to 11.

9. The photovoltaic module according to claim 1, wherein the photovoltaic module is manufactured through a lamination process, the protective adhesive layers are formed by pressing adhesive films applied in advance to cover the front surface and the back surface of the solar cell string, a difference between the thickness of one adhesive film and the thickness of the solder strip is defined as a second thickness, and a ratio of the second thickness to the thickness of one adhesive film is not less than 25% and not greater than 40%.

10. The photovoltaic module according to claim 9, wherein the ratio of the second thickness to the thickness of one adhesive film being not less than 25% and not greater than 35%.

* * * * *